United States Patent [19]

Landau et al.

[11] Patent Number: 4,857,160
[45] Date of Patent: Aug. 15, 1989

[54] HIGH VACUUM PROCESSING SYSTEM AND METHOD

[75] Inventors: Richard F. Landau, Londonderry, N.H.; William E. Millikin Jr., Acton, Mass.; Jerzy P. Puchacz; Manolito Q. Reyes, both of Nashua, N.H.; Walter Schadler, Triesen, Liechtenstein

[73] Assignee: Oerlikon-Buhrle U.S.A. Inc., New York, N.Y.

[21] Appl. No.: 224,450

[22] Filed: Jul. 25, 1988

[51] Int. Cl.$^4$ .............................................. C23C 14/56
[52] U.S. Cl. ............................... 204/192.12; 118/719; 156/345; 204/298; 414/217; 414/221
[58] Field of Search ............................... 414/217, 221; 204/192.12, 298 MC, 298 MS; 118/719, 720-721, 729, 730, 733; 156/345

[56] References Cited

U.S. PATENT DOCUMENTS

| | | | |
|---|---|---|---|
| 4,500,407 | 2/1985 | Boys et al. | 204/298 |
| 4,733,631 | 3/1988 | Boyarsky et al. | 118/719 |
| 4,735,540 | 4/1988 | Allen et al. | 414/222 |
| 4,808,291 | 2/1989 | Denton et al. | 204/298 |

*Primary Examiner*—Aaron Weisstuch
*Attorney, Agent, or Firm*—Schiller, Pandiscio & Kusmer

[57] ABSTRACT

A novel method and machine are provided for processing workpieces at one or more work-stations under vacuum conditions. The machine comprises means for receiving at atmospheric pressure an object to be processed, an inlet lock that is connected to a vacuum manifold, at least one processing station that is at a pressure at least as low as $10^{-1}$ to $10^{-6}$ mm. Hg., means for conveying work-pieces to be processed into and through the input lock to said at least one processing station so that the pressure within the processing chamber is not adversely affected by introduction of work-pieces thereto via the input lock, an output lock, and means for transferring workpieces from said at least one processing station into the output lock so that the pressure in said at least one processing station is not adversely affected by such transfer.

30 Claims, 16 Drawing Sheets

HIGH VACUUM PROCESSING SYSTEM AND METHOD

This invention relates to a workpiece processing machine that involves at least one high vacuum chamber.

In the electronic industry, a number of objects or workpieces are required to be brought temporarily into working (i.e. processing) chambers in which relatively low pressures, e.g., pressures with a magnitude in the order of $10^{-3}$ to $10^{-6}$ mm. Hg are required. Such work chambers are commonly identified as "vacuum chambers" or "high vacuum chambers". The use of very low pressures is easily accommodated in batch process equipment where one or more articles or workpieces are processed in a working chamber, and sufficient time is available to evacuate the low pressure working chamber after the introduction of the articles or workpieces. However, present day industrial requirements necessitate the use of machines wherein workpieces to be processed are introduced one after the other into the processing machine, and then removed again from the working pressures prevailing in the work chamber without having to change the pressure in the work chamber. Accordingly, pressure lock systems have been devised for the introduction of workpieces into a vacuum chamber and the subsequent removal therefrom, without having to modify the working pressure prevailing in the work chamber. As described in U.S. Pat. No. 3,756,435, such prior art systems may utilize rotatable or reciprocatable tables having a plurality of workpiece holders which, upon movement of the table, are brought in succession into a loading station, a working station located within a vacuum chamber, and a discharging station. In such systems pump means are provided at least in the loading station or between the loading station and the vacuum chamber in order to bring the pressure in the atmosphere surrounding the workpiece(s) to the level of the pressure prevailing in the vacuum chamber.

U.S. Pat. No. 3,756,435, discloses a pressure lock system for introducing and removing workpieces from a high vacuum work chamber within which work may be performed on the workpieces. The system of U.S. Pat. No. 3,756,435 involves the use of an inlet lock channel, an outlet lock channel, and a plurality of sealing elements having an outer peripheral shape that conforms to the profile of the interior peripheral area of the inlet and outlet lock channels, with the sealing elements being connected to one another by intermediate connection elements so as to form a chain with the sealing elements held in spaced relation to one another. Workpieces are supported by the holding devices carried by the sealing elements on the intermediate connecting elements. The same system includes means for feeding the chain of successive sealing elements into the inlet lock channel, through the working chamber, and out into the outlet lock channel.

The system disclosed in U.S. Pat. No. 3,756,435 offers the advantage that the pressure within the vacuum chamber need not be modified as the articles that are being processed are moved into and out of the vacuum chamber. However, the system disclosed by U.S. Pat. No. 3,756,435 offers a number of disadvantages, including the need to provide adequate space to accommodate the inlet and outlet lock channels and inconvenience with respect to the handling of workpieces. Other disadvantages of the system of U S. Pat. No. 3,756,435 are obvious to persons skilled in the art.

Another machine that is directed to the same problem is a metallizing machine produced by Denton Vacuum Inc. of 2 Pin Oak Lane, Cherry Hills, N.J., that is especially adapted to metallize compact discs. Full details of the Denton machine are presently unavailable, although it appears that the Denton machine utilizes a turntable and a pair of cylindrical pressure lock chambers for moving compact discs continuously from atmospheric pressure to high vacuum and back again to atmospheric pressure without the need for valves or doors to prevent leakage of vacuum from the working vacuum chamber. U.S. Pat. No. 4,733,631 is believed to illustrate the general arrangement of the Denton machine.

SUMMARY OF THE PRESENT INVENTION

The primary object of the present invention is to provide a new and improved machine for processing workpieces one at a time in a vacuum chamber having a pressure of between $10^{-1}$ and $10^{-6}$ mm Hg., with the vacuum chamber consisting of one or more work stations where the workpieces are subjected to different process conditions.

A more specific object of the invention is to provide a processing machine of the type described that comprises means for receiving an object to be processed at atmospheric pressure, an inlet lock channel that is connected to a vacuum manifold, an output lock channel that is connected to the same or different vacuum manifold, at least one processing station that is at a pressure at least as low as $10^{-1}$ to $10^6$ mm. Hg., means for conveying articles to be processed through the input lock chamber to said at least one processing station so that the pressure within the processing chamber is not adversely affected by introduction of workpiece thereto via the input lock channel, and means for transporting workpieces from said at least one processing station into the output lock channel so that the pressure in said at least one processing station is not adversely affected.

A further object of the invention is to provide a machine for processing articles in a vacuum chamber wherein the articles are transported in the machine on individual carriers that are adapted to make a sealing connection with input and output lock channels that lead to and from the vacuum chamber.

Still another object is to provide a new and improved method of processing compact disk blanks.

These and other objects are achieved by means of a machine that preferably comprises the following: a vacuum chamber, at least one processing station connected to the vacuum chamber so that the pressure within said at least one processing station is substantially the same as the pressure within the vacuum chamber, an input lock leading to the vacuum chamber, an output lock leading from the vacuum chamber, a workpiece feeding station where workpieces to be processed are received for processing, a workpiece output station where workpieces that have been processed are delivered for removal from the machine, a first turntable for conveying workpieces to be processed from the workpiece feeding station to the first lock channel and from the output lock channel to the workpiece output station, a second turntable disposed to receive workpieces from the input lock channel and transport each workpiece in turn to said at least one processing station and thereafter from said at least one processing station to said output lock channel, means for causing unprocessed workpieces to be stacked in the input lock channel one behind the other and for causing said workpieces to be delivered from said input lock channel one by one to said second turntable, and means for causing workpieces that have been processed to be stacked in said output lock channel one behind the other and for forcing processed workpieces to be delivered one by one to said first turntable for delivery thereby to said workpiece output station.

Other features and many of the attendant advantages and possible modifications of the invention are made apparent by the following description which is to be considered together with the following drawings.

THE DRAWINGS

Figure 15:
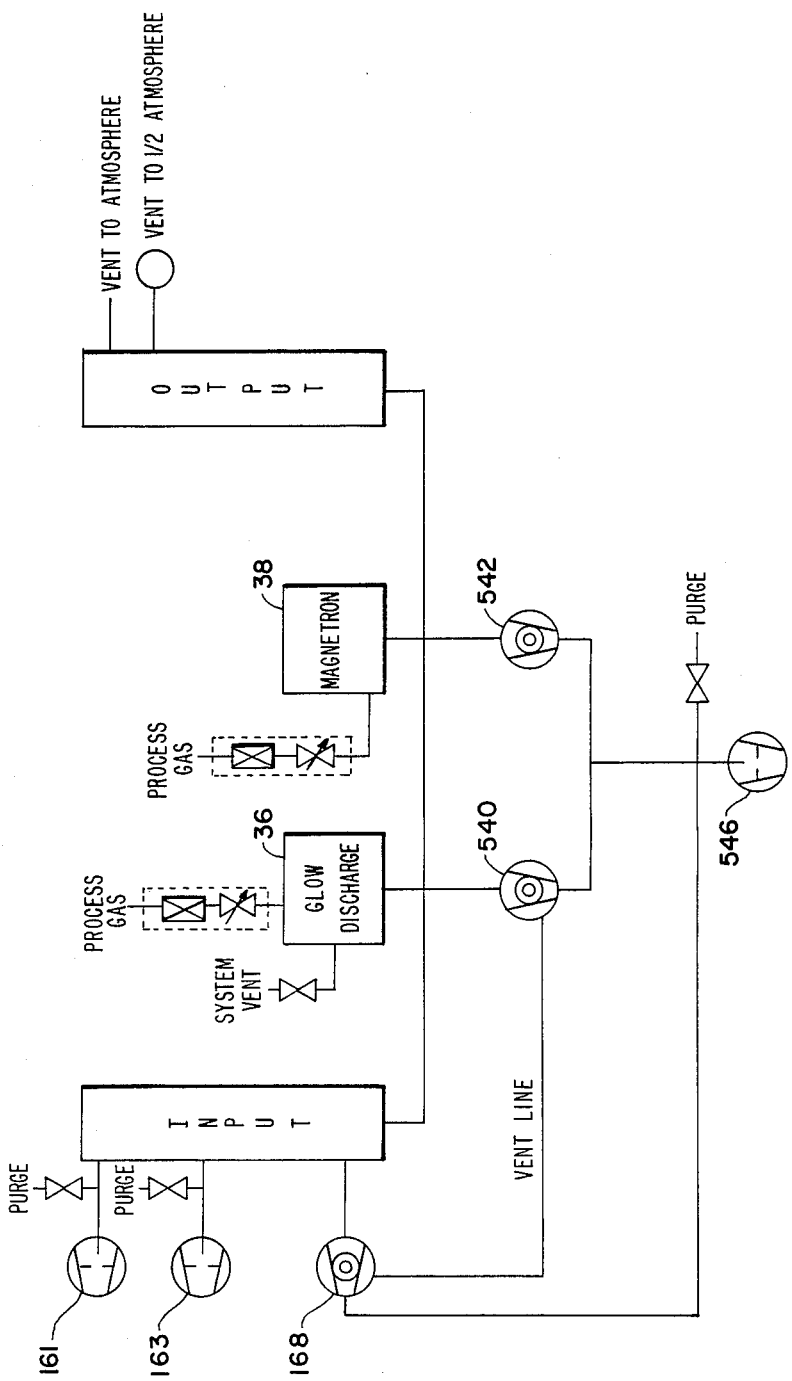

FIG. 15 schematically illustrates the vacuum system of the machine; and

Figure 16:
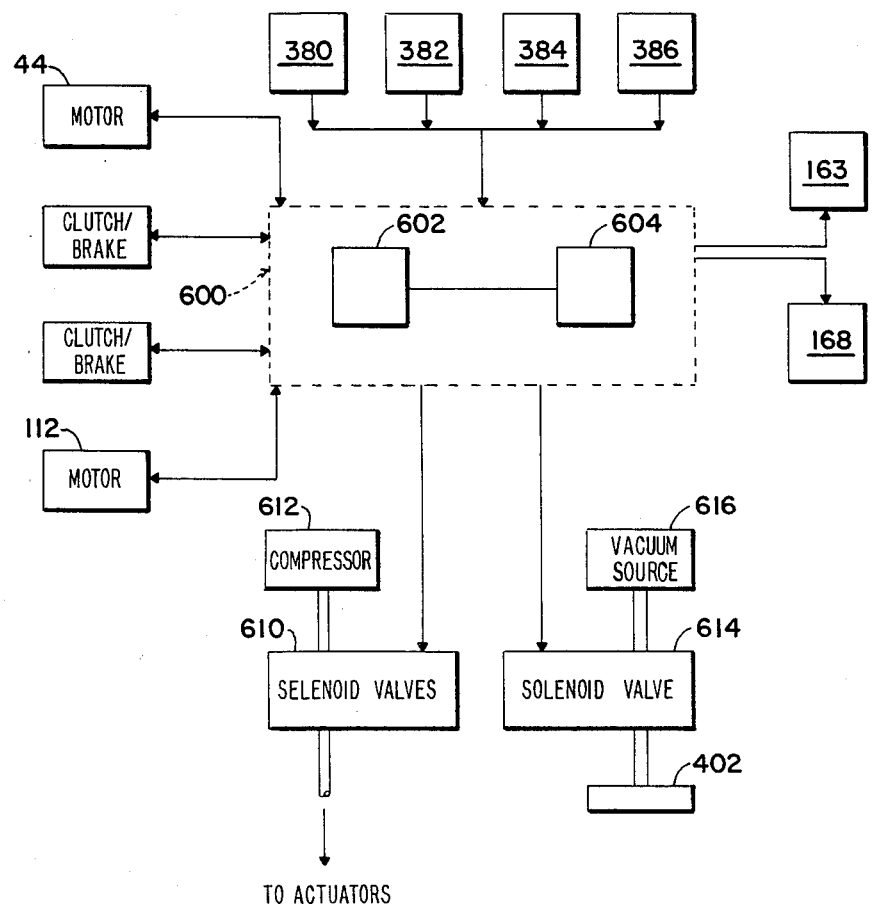

FIG. 16 is a schematic diagram of the control system of the machine.

PREFERRED EMBODIMENT OF THE INVENTION

FIGS. 1-16 relate to a machine used in the manufacture of compact video discs. More particularly, the illustrated machine is designed to metallize compact disc blanks, i.e., to deposit a thin layer of aluminum or other selected metal onto a selected annular portion of a disc blank. It is to be noted that the disc blanks are generally made of a transparent plastic material, and that the recording area of the compact disc is an annular area that is spaced from the inner and out margins of the disc.

Figure 1:
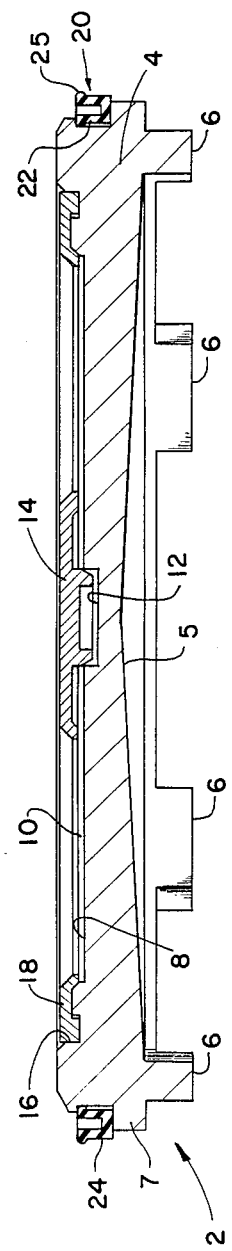
FIG. 1 is a cross-sectional view of a disc carrier with a disc and inner and outer masking components placed on the disc.

Referring now to FIG. 1, the illustrated machine is designed to utilize a series of disc carriers 2 that are circular in configuration and consist of a body section 4 with a generally concave bottom surface 5, a plurality of legs 6 extending down from its bottom side, and a peripheral lip 7. The upper side of the carrier 2 has a contoured depression comprising an annular surface 8 sized to receive a compact disc blank 10, a center deeper depression 12 designed to receive the center portion of a circular center mask 14, and a peripheral groove 16 designed to accommodate the ribbed portion of an annular outer mask member 18. The carrier 2 also has a peripheral groove at the upper side of lip 7 in which is seated a resilient sealing ring 20 that is U-shape in cross-section. The inner portion 22 of sealing ring 20 tightly engages the carrier 2, while the outer wall portion 24 of sealing element 20 projects beyond the peripheral surface of the carrier and preferably has a bead 25. Sealing element 20 is sized so that its bead 25 will make a tight sealing but sliding engagement with input and output lock channels of the machine hereinafter described.

Figure 2:
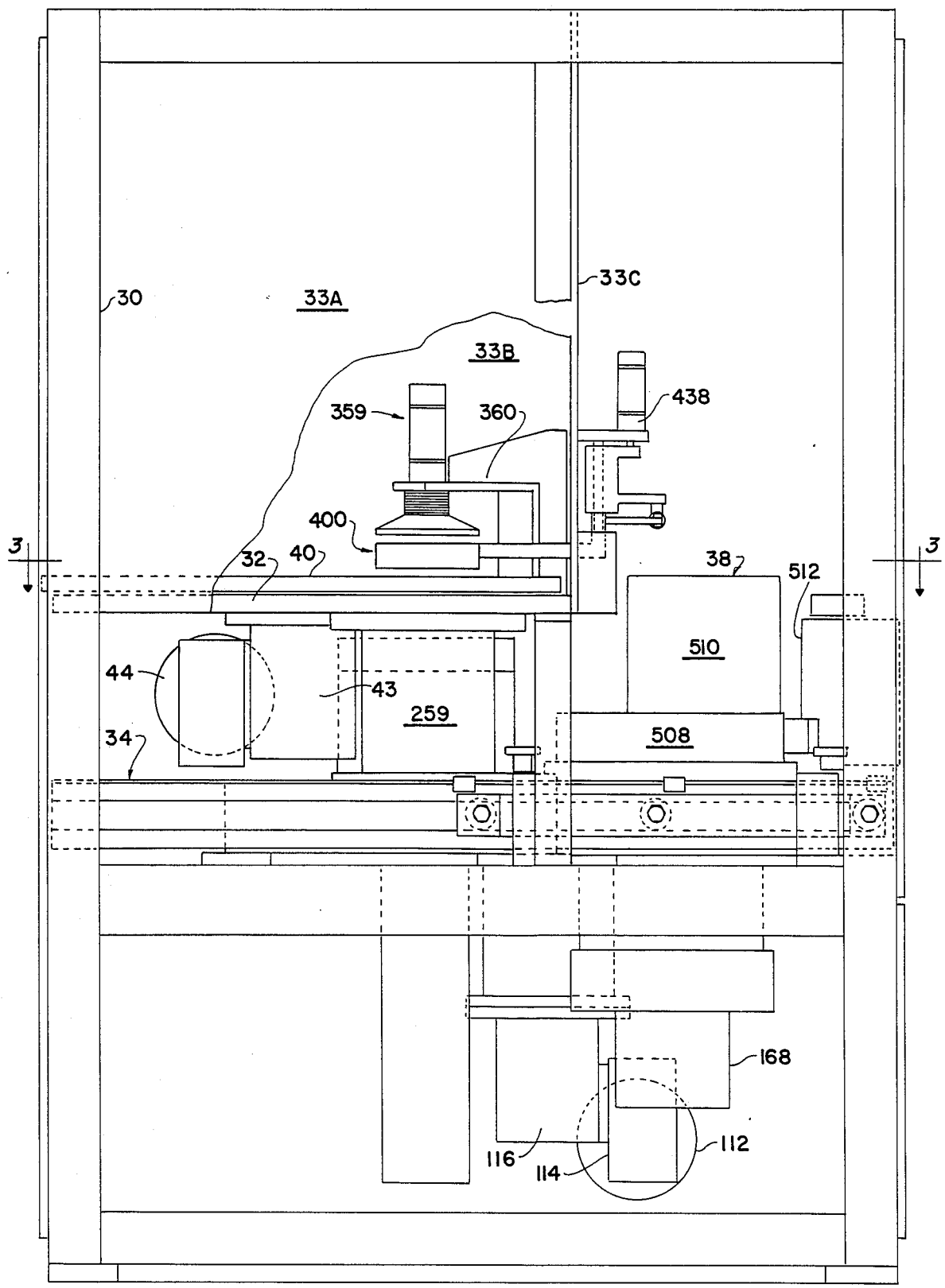
FIG. 2 is a side elevation, with certain portions broken away, of a machine constructed in accordance with the present invention.
Figure 3:
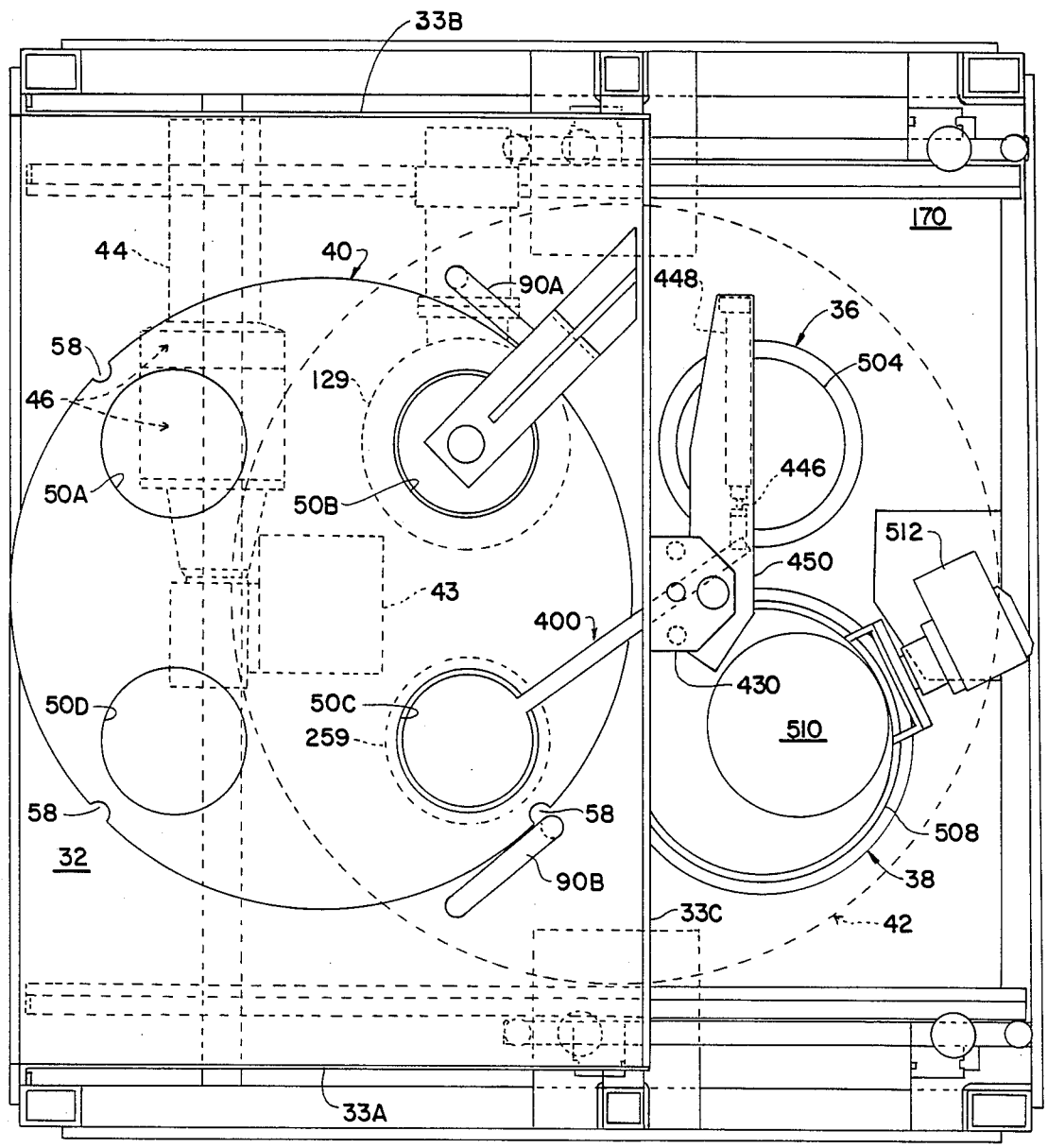
FIG. 3 is a plan view (with certain components omitted for clarity) taken along lines 3—3 in FIG. 2 showing the positional relationship of the two turntables.

Referring now to FIGS. 1, 2 and 3, the machine comprises a rectangular open frame 30 which supports a fixed platform 32, three vertical side walls 33A, 33B, and 33C extending upwardly from platform 32, and a vacuum chamber identified generally at 34. Associated with the vacuum chamber 34 are two disk-processing stations 36 and 38. Platform 32 supports a first turntable 40, while a second turntable 42 is located within vacuum chamber 34. Turntable 40 is located at a higher level than turntable 42, and their axes of rotation are displaced horizontally from one another.

Turning now to FIGS. 2 and 3, turntable 40 is rotatably supported by the output shaft of a cam indexer unit 43 that is mounted to the underside of platform 32 and is driven by an indexing motor 44 acting through an electrical clutch/brake coupling unit 46. Operation of motor 44 causes the turntable to rotate clockwise (as viewed in FIG. 3). As seen in FIG. 3, the turntable 40 has four openings 50(A-D) that are displaced from one another by an angle of 90 degrees. Motor 44 is operated so as to index turntable 40, i.e., cause it to rotate stepwise, by angle increments of 90 degrees. Each time the turntable is stopped, each of the holes 50 will be in one of the positions represented by the designations 50A-D in FIG. 3. The clutch/brake coupling unit is arranged so that when its clutch is engaged and its brake is off, a driving connection is provided between motor 44 and cam indexer unit 43, whereby to permit rotation of the turntable. As is obvious to a person skilled in the art, when the brake is engaged and the clutch is disengaged, the turntable is locked against further rotation. Motor 44 and clutch/brake unit 46 are coordinated so that motor 44 is energized when or immediately after the clutch is engaged and the brake is de-energized, and the clutch is disengaged and the brake is engaged when the motor is de-energized.

The apertures 50 in turntable 40 are oversized with respect to the disk carriers 2 by a small diameter difference, e.g., 0.005 to 0.010 inch, but are provided with latch-type carrier holding means for holding carriers in place. The carrier holding means and the means for unlatching them are shown in FIGS. 3 and 5-8.

Figure 5:
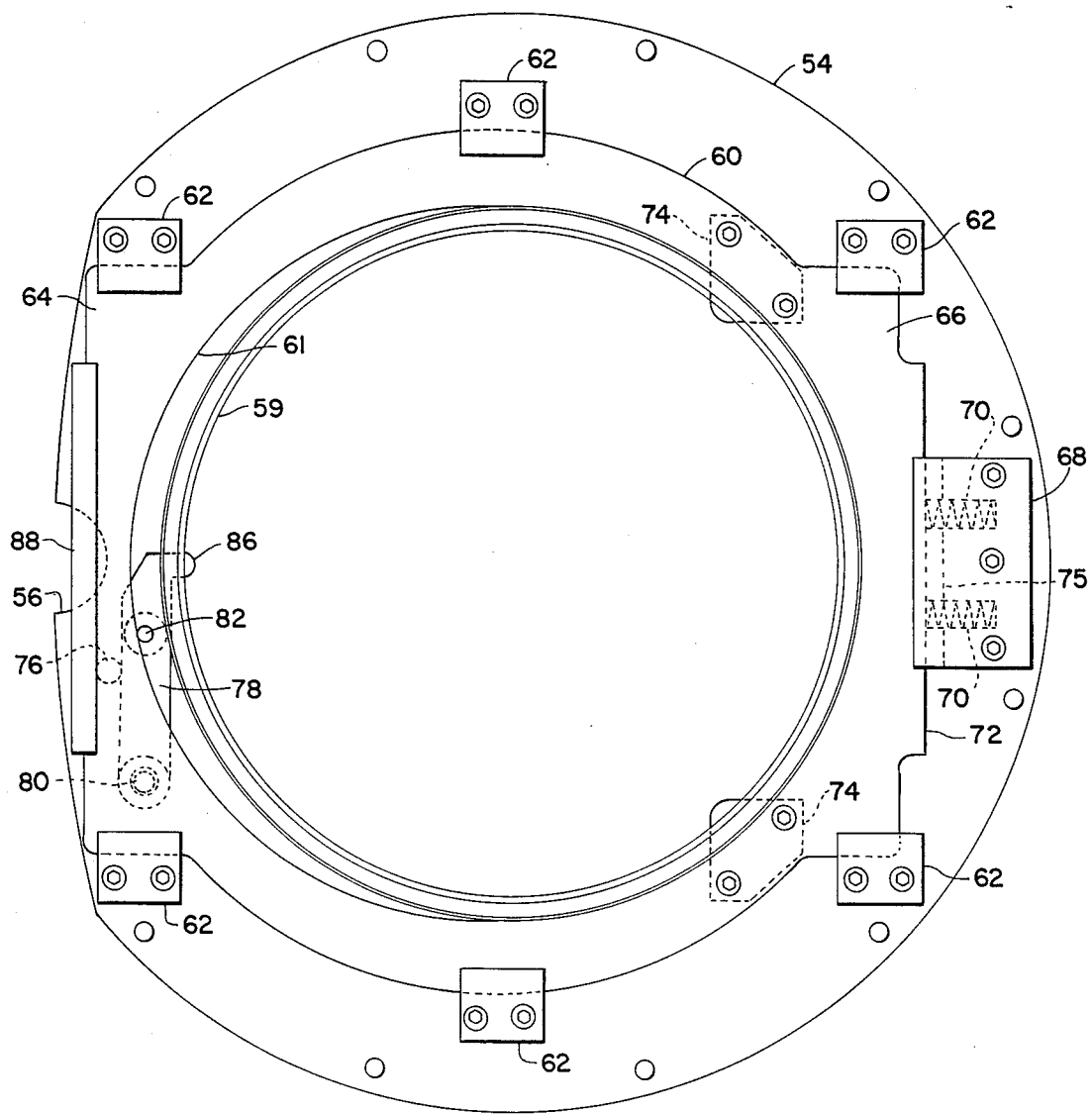
FIG. 5 is a bottom view of the latch assembly for the upper turntable.
Figure 6:
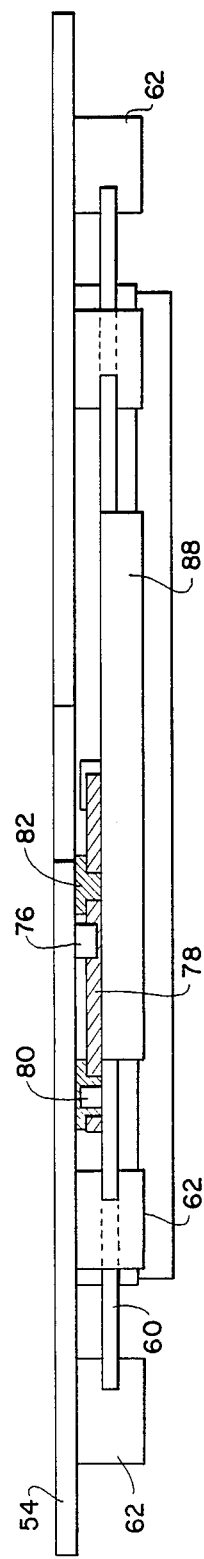
FIG. 6 is a side view of the same latch assembly.

The carrier holding means comprises four identical latch-type carrier holding assemblies attached to the underside of turntable 40 at different ones of the four apertures 50A-D. As seen in FIGS. 5-8, each carrier holding assembly comprises a ring 54 that is affixed to the turntable and has a semi-circular peripheral notch 56 that is aligned with an identically-shaped notch 58 (FIG. 3) in the outer edge of the turntable. Each ring 54 has a circular center hole 59 that is the same size as or slightly oversized with respect to disk carriers 2, e.g., oversized by a diameter difference of about 0.005 to 0.010 inches. A carrier holding ring 60 is slidably attached to ring 54 by six grooved slide blocks 62. Ring 60 has a semi-elliptical center hole 61 that is oversized relative to the center hole of ring 54. The right-hand half (as seen in FIG. 5) of hole 61 is circular and concentric with center hole 59 while the left-hand half has an elliptical curvature. Ring 60 has two diametrically opposed extensions 64 and 66 that have straight opposite side edges that coact with the slide blocks to guide the ring so that it is free to undergo reciprocal sliding motion along an axis that intersects the centers of ring 54 and notch 56.

An additional grooved limit or stop block 68 is attached to ring 54. Stop block 68 has a groove 75 to slidably accommodate extension 66, plus a pair of blind holes in which are located a pair of compression springs 70. Those springs engage the flat end edge surface 72 of extension 66 and urge ring 60 away from block 68. Attached to the upper sides of ring 60 are two identical tab plates 74 that protrude beyond the circular inner edge of ring 60.

The base of groove 75 in block 68 limits movement of ring 60 in one direction, i.e., to the right as viewed in FIG. 5. Movement of ring 60 away from block 68 is limited by action of a stop pin 76 attached to the underside of ring 54 against a lever 78. One end of lever 78 is rotatably mounted to a pivot pin 80 attached to ring 60. A spacer element 82 is disposed between ring 54 and lever 78. The other end of the lever has a right-angled extension 86 that acts as a third tab. When lever 78 is with engaged stop pin 76, the lever is angled so that extension 86 projects beyond the circular inner edge of ring 54, where it coacts with tab plates 74 to provide a 3-point support for a carrier that is deposited into the associated, i.e., corresponding, turntable hole 50. Normally, each ring 60 is held away from the associated stop block 68 by its springs 70, so that the associated extension 86 and plates 74 provide a 3-tab support for a carrier.

Movement of a ring 60 toward its associated slide block 68 is achieved by one or the other of two identical unlatching mechanisms hereinafter described that are adapted to engage a bumper member 88 that is fixed on the flat end edge of each extension 64 and extends across the aligned notches 56 and 58 when movement of ring 60 is limited by stop pin 76, i.e., when the ring is in the position shown in FIG. 5. One unlatching mechanism is disposed to operate the carrier holding assembly associated with that one of the holes 50 that is in the position of hole 50B (FIG. 3), while the other unlatching mechanism is disposed to operate the carrier holding assembly associated with that one of the holes 50 that is in the position of hole 50C.

Figure 7:
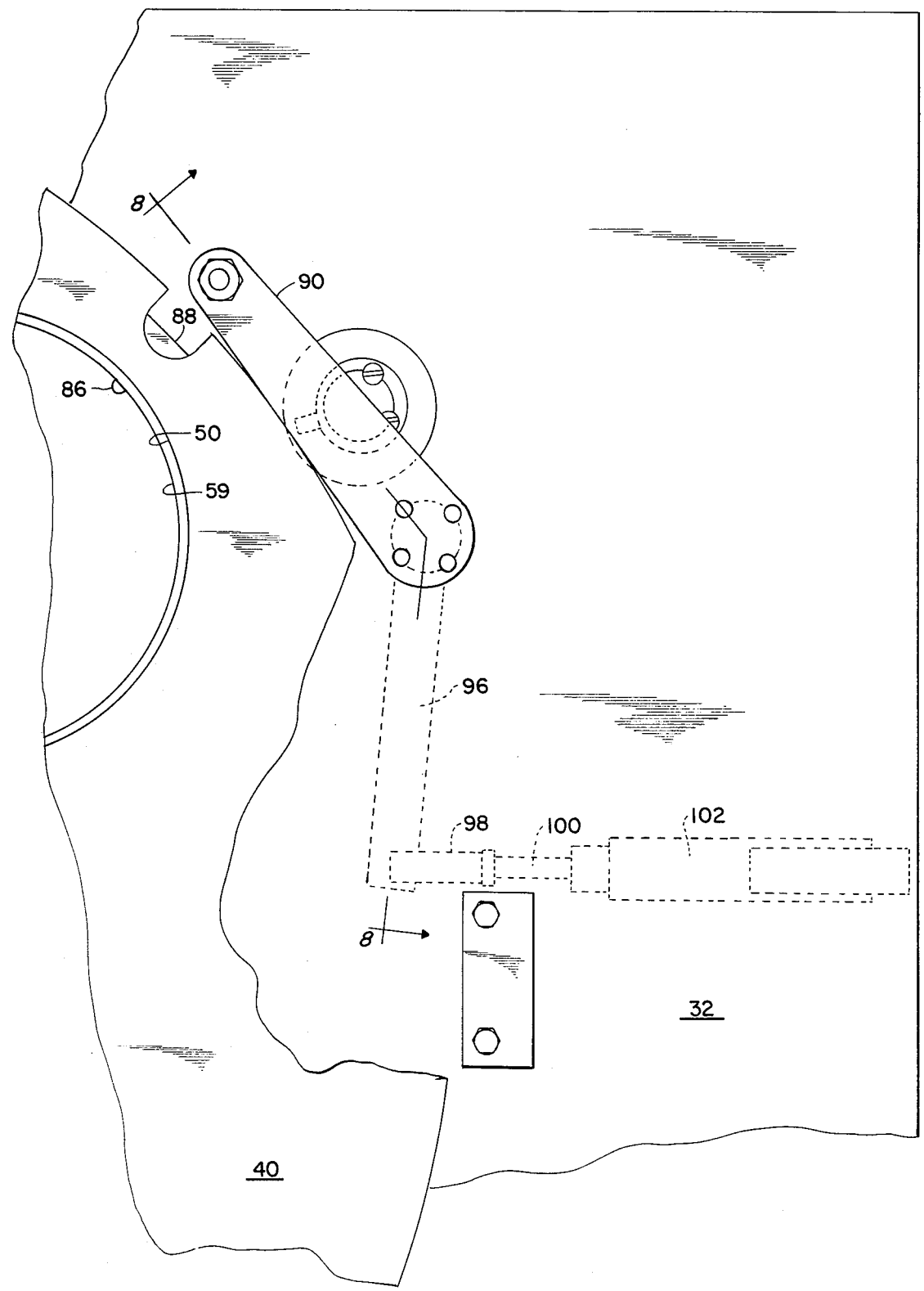
FIG. 7 is a fragmentary view showing the latch releasing mechanism for the upper turntable.
Figure 8:
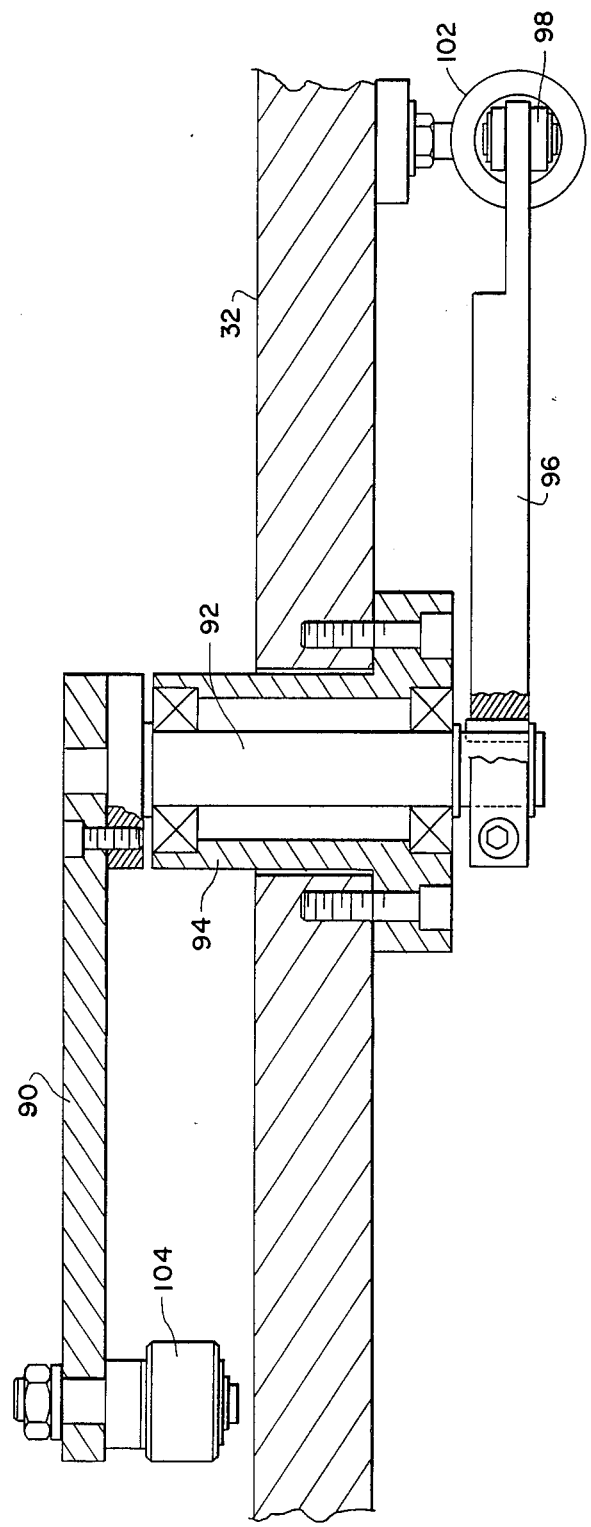
FIG. 8 is a view taken along line 8—8 of FIG. 7.

One of the two identical unlatching mechanisms is shown in FIGS. 7 and 8. It comprises a lever arm 90 that is attached to one end of a shaft 92 journalled in a bearing support 94 mounted in an opening in platform 32. To facilitate understanding of the present invention, the levers 90 of the two identical unlatching mechanisms are identified as 90A and 90B in FIG. 3. The other end of shaft 92 is secured to one end of a crank arm 96. The other end of arm 96 is pivotally connected to a connecting member 98 secured to the end of the operating rod 100 of an actuator 102. The actuator is preferably a pneumatic device, but a hydraulic actuator or an electrical solenoid type actuator may be used instead. The actuator is attached to the underside of platform 32. The free end of lever arm 90 carries a roller 104 that is sized so as to fit in the notches 56 and 58. Normally the operating rod 100 of actuator 102 is in its extended position (FIGS. 3 and 7), causing the roller 104 to be spaced from the turntable. When the actuator is caused to change states so as to retract operating rod 100, roller 104 will move into notches 56 and 58, thereby engaging bumper 88 and pushing ring 60 further into the groove 75 in stop block 68 by an amount sufficient to cause tab plates 74 to move out of the space defined by hole 59. This movement of ring 60 also causes lever 78 to pivot enough to move its tab extension 86 out of the space defined by hole 59. When ring 60 is in the position shown in FIG. 5, tabs 74 and 86 will support a carrier deposited in the associated hole 50, and when actuator 102 causes roller 104 to force ring 60 to the right (as seen in FIG. 5), tabs 74 and 86 will move out of supporting position so as to release the supported carrier. When operating rod 100 of actuator 102 is again extended to remove roller 104 from notches 56 and 58, springs 70 will cause ring 60 to return to its original carrier supporting position. It is to be appreciated that each time the turntable is indexed, the notches 56, 58 associated with the holes represented as 50C and 50D will be aligned with rollers 104 of the two unlatching assemblies.

Because there are two unlatching assemblies located as shown in FIG. 3, the carrier holding assemblies will be in latched position, i.e., in carrier holding position, when their associated holes 50 are in the positions of holes 50A and 50D in FIG. 3, and they can be unlatched only when moved to the positions represented by holes 50B and 50C in FIG. 3.

Referring now to FIGS. 3 and 9–12, turntable 42 has four holes or openings 110 (FIGS. 10 and 12) to accommodate carriers 2. Each hole 110 is counterbored so as to provide an annular shelf 111 that is sized so as to engage and support the carrier's lip 7 while providing clearance for the carrier's legs 6. Holes 110 are located equi-distant from the axis of rotation of the turntable. Furthermore, holes 110 are equally spaced from one another about the axis of the turntable, i.e., each hole 110 is spaced 90 degrees from the next adjacent hole. Additionally, the centers of holes 50 and 110 are spaced equally from the axes of rotation of turntables 40 and 42 respectively, and those axes are spaced horizontally from one another by an amount equal to the radial distance between the centers of holes 50 and the axis of turntable 40.

Turntable 42 is located within vacuum chamber 34. The mechanism for rotating turntable 42 is attached to the lower wall (hereinafter identified) of vacuum chamber 34. That mechanism comprises an indexing electric motor 112 (FIG. 2) coupled by an electrical clutch/brake unit 114 to a cam indexer unit 116 having an output shaft (not shown) that supports turntable 42 and is rotatably mounted in the upper and lower walls of vacuum chamber 34.

Motor 112, clutch/brake unit 114 and cam indexer unit 116 are adapted to rotate turntable 42 stepwise, i.e., intermittently, with each step movement involving clockwise rotation of the turntable so that its holes 110 are advanced by 90 degrees. Further, those power driving elements are operated in synchronism with the corresponding power drive components associated with turntable 40, so that each time turntable 40 is indexed 90 degrees, a corresponding movement is achieved by turntable 42, albeit not simultaneously. Moreover, each time turntable 42 is indexed 90 degrees, two of its holes 110 are placed in axial alignment with holes 50B and 50C, while its two other holes 110 are not axially aligned with any of the holes 50.

Figure 10:
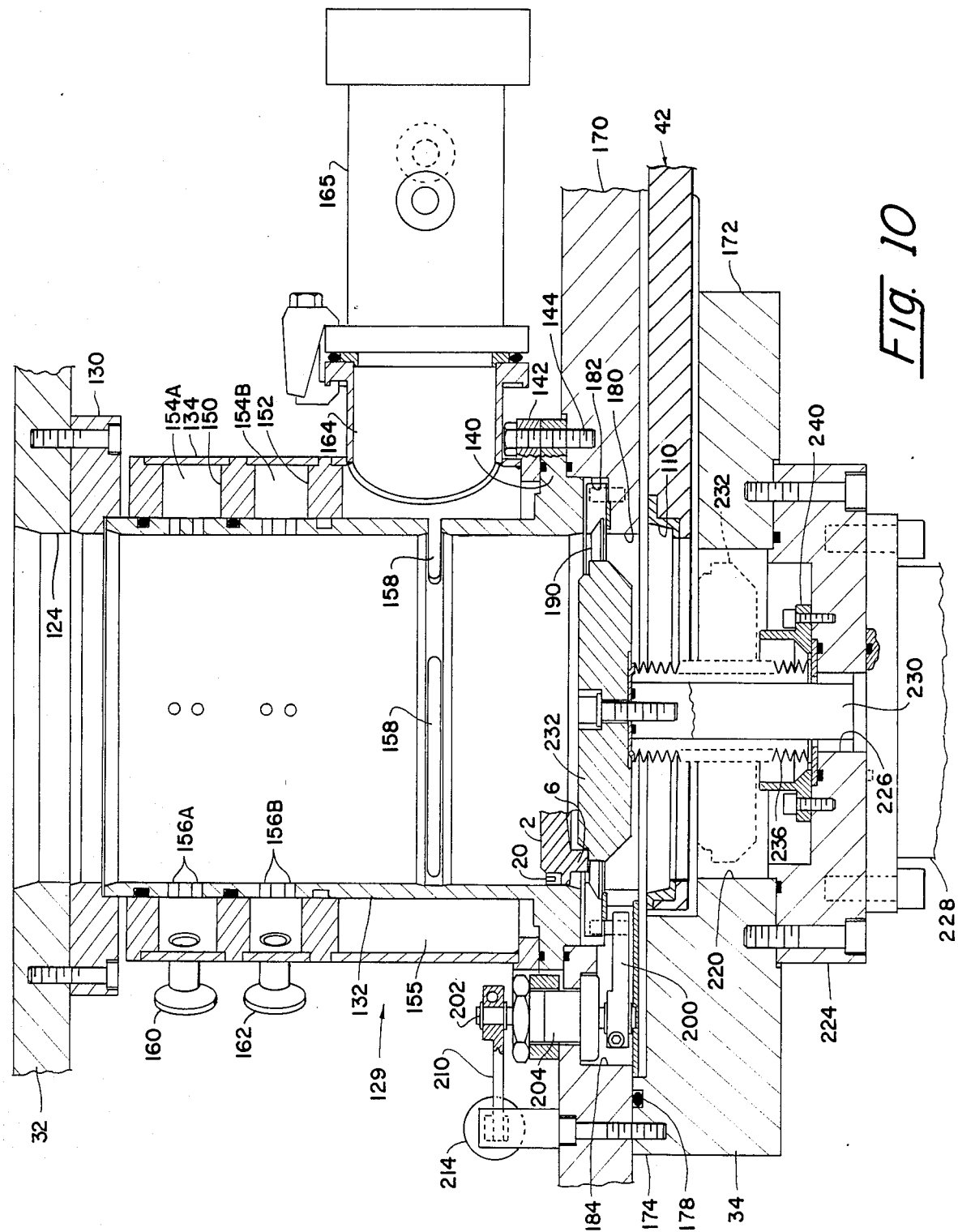
FIG. 10 is a sectional view in side elevation of the input stack assembly.
Figure 12:
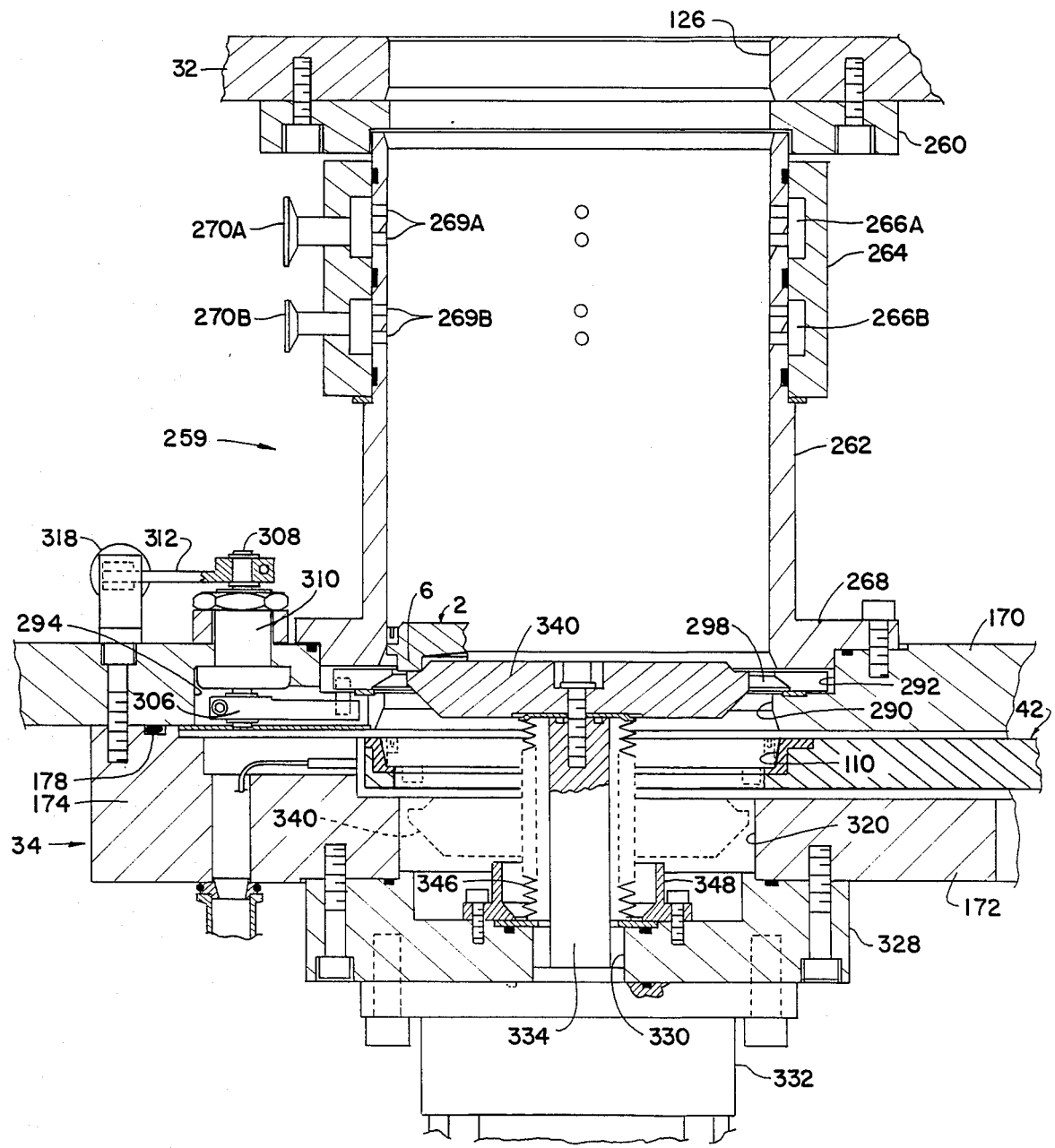
FIG. 12 is a sectional view in side elevation of the output stack assembly.

Referring now to FIGS. 10 and 12, the platform 32 has two apertures 124 and 126 that are spaced apart by 90 degrees and are located adjacent vertical partition 33C. With respect to FIG. 3, aperture 124 is aligned with hole 50C and aperture 126 is aligned with hole 50D of the turntable.

Bolted to the underside of platform 32 at aperture 124 is an input stack assembly 129 that functions as an input lock. The input stack assembly comprises a collar 130, a cylindrical inner sleeve 132, an outer cylindrical jacket 134, a bottom flange 140 on sleeve 132, and a clamp ring 142 that coacts with bolts 144 to clamp flange 140 to the upper wall 170 of vacuum chamber 34.

The inner diameter of sleeve 132 is slightly smaller than the outer diameter of the outer portion 24 of a carrier sealing element 20 in unflexed condition, i.e., when the portion 24 of the sealing element is not being compressed radially toward inner portion 22. Consequently when a carrier is pushed down through aperture 124 and collar 130 into sleeve 132, its sealing element 20 will make a sliding hermetic seal with sleeve 132. The diameter of aperture 124 and the inner diameter of collar 130 may be larger than, but preferably are the equal to the inner diameter of sleeve 132.

Jacket 134 is spaced from sleeve 132 by a pair of dividing rings 150 and 152. Rings 150 and 152 divide the annular space between sleeve 132 and jacket 134 into two roughing compartments 154A and 154B and a high vacuum manifold 155. Sleeve 132 has small holes 156A and 156B that connect compartments 154A and 154B, respectively, to the interior of sleeve 132. Sleeve 132 also has a series of larger circumferentially-elongated holes 158 that connect vacuum manifold 155 with the interior of sleeve 132. Jacket 134 has three ports 160, 162 and 164 (solely for convenience of illustration, the positions of ports 160 and 162 relative to port 164 are different in FIGS. 9 and 10). Ports 160 and 162 lead to compartments 154A and 154B respectively, while port 164 leads to vacuum manifold 155. Ports 160 and 162 are connected to rotary vane vacuum pumps 161,163 (FIG. 15) that are capable of pumping the interior of sleeve 132 down to a pressure in the range of 100 to $10^{-1}$ mm. Hg. while port 164 is connected by a connecting line 165 to a turbo-molecular vacuum pump 168 (FIGS. 2 and 15) attached to the bottom wall of the vacuum chamber. Pump 168 functions to maintain the lower end of the interior of sleeve 132 at a reduced pressure in the range of $10^{-3}$ to $10^{-6}$ mm. Hg. The fluid pressure at the bottom of sleeve 132 is greater than the fluid pressure at the top of that sleeve only when one or more carriers are disposed therein, since each carrier forms a separate seal with the sleeve.

Vacuum chamber 34 also comprises a bottom wall 172 having a peripheral lip 174 that functions as the side wall of the vacuum chamber Side wall 174 is bolted to upper wall 170 with suitable resilient sealing means, e.g., an O-ring 178, being used to provide an hermetic seal between the upper and lower sections of the vacuum chamber. The second turntable 42 is located between and spaced from upper and lower walls 170 and 172 of the vacuum chamber.

Upper wall 170 has a hole 180 that is aligned with and communicates with sleeve 132, whereby the interior of vacuum chamber 34 is maintained by action of turbomolecular vacuum pump 168 at a reduced pressure in the range of $10^{-3}$ to $10^{-6}$ mm Hg.

Figure 9:
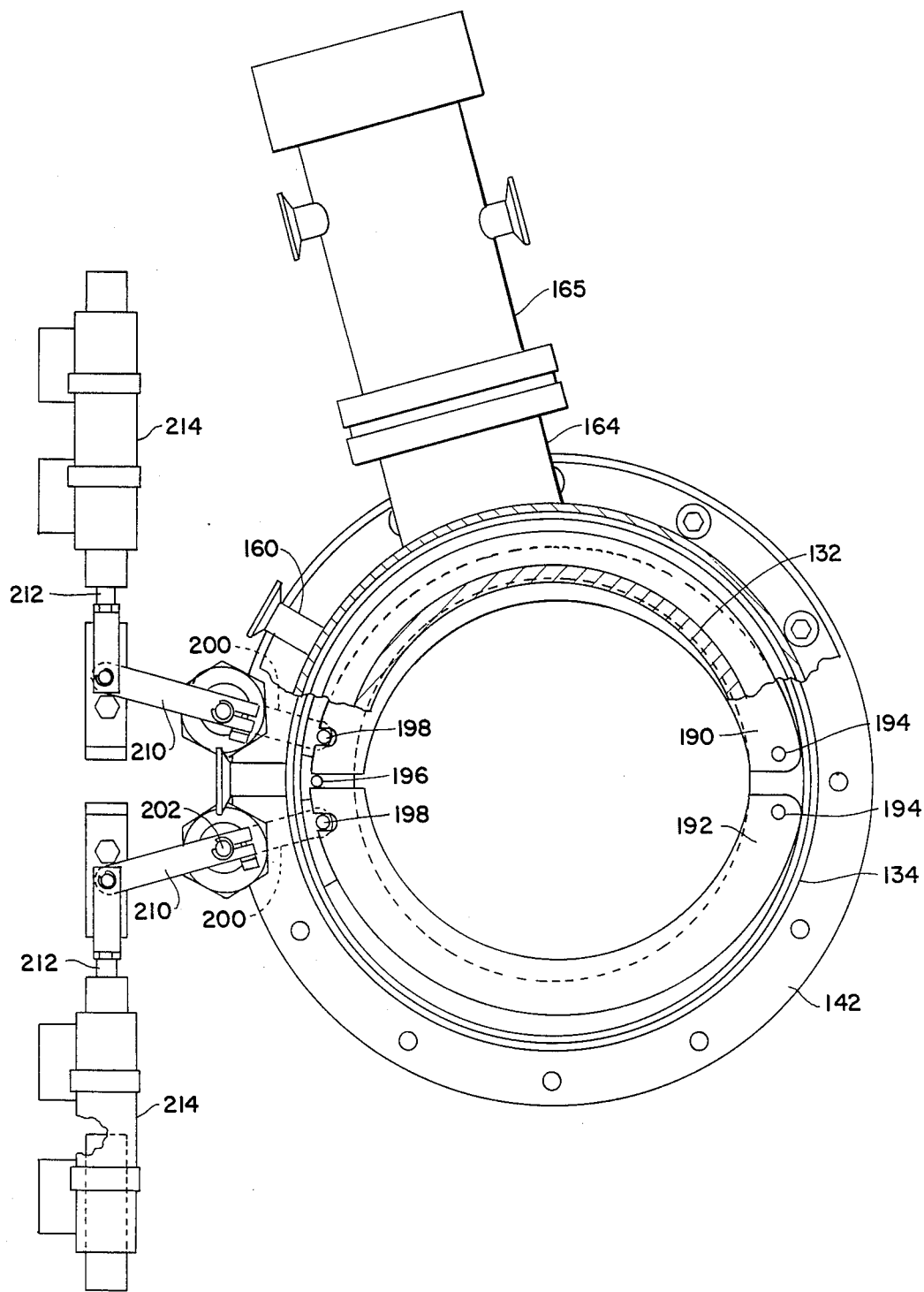
FIG. 9 is a plan view, partially in section, of the input stack assembly.

The inner diameter of hole 180 is the same as or slightly larger than the inner diameter of sleeve 132. Upper wall 170 also has a counterbore 182 and a side recess 184 (FIG. 10) that communicates with hole 180 and counterbore 182. Mounted in counterbore 182 are two semi-circular carrier stop members 190 and 192 (FIG. 9). Those members are pivotally supported at one end on pivot pins 194 that are anchored in upper wall 170 at counterbore 182. The opposite ends of carrier stop members 190 and 192 are separated by a stop pin 196 anchored in top wall 170, and have identical semi-circular notches to accommodate pins 198 that are affixed to the ends of two identical levers 200 secured to the ends of identical shafts 202. The two shafts 202 are rotatably supported in identical hermetically sealed bearing units 204 (FIG. 10) that are mounted in suitable holes in upper wall 170. The upper ends of shafts 202 protrude outside of the vacuum chamber and are connected to the ends of identical levers 210. The opposite ends of levers 210 are pivotally connected to the operating rods 212 of two pneumatic actuators 214 that are affixed to the upper side of top wall 170 of the vacuum chamber. The inner edges of carrier support members 190 and 192 are circular and have a radius of curvature the same as that of the inner surface of sleeve 132. However, shafts 202 are located so that (a) when the operating rods 212 are retracted (as shown in FIG. 9), the two carrier stop members are positioned so that their inner edges extend into a projection of the interior space of sleeve 132, and (b) when the operating rods are extended, carrier stop members 190 and 192 are pivoted to a new position where their inner edges are aligned with the inner surface of sleeve 132. Hence, When the carrier stop members are in the position of FIG. 9, they can interrupt and support a disk carrier, but when they are moved away from one another so that their inner edges are aligned with the inner surface of sleeve 132, they permit a disk carrier to be passed between them.

The bottom wall 172 of the vacuum chamber has a hole 220 that is aligned with hole 180 and sleeve 132. Affixed to the underside of wall 172 is a mounting plate 224 having a center hole 226. Bolted to mounting plate 224 is a pneumatic actuator 228, only part of which is illustrated in FIG. 10. The operating or piston rod 230 of actuator 228 extends slidably through center hole 226, and attached to its upper end is a carrier elevator or platform 232. The latter has a flat top surface, plus a peripheral groove at its upper end to accommodate the legs 6 of a disk carrier 2. A bellows 236 surrounds piston rod 230, with its upper end attached to elevator 232 and its lower end attached to mounting plate 224 by a collar assembly 240 that also may act as a bottom stop for the elevator. Bellows 236 provides an hermetic seal around piston rod 230 so that air cannot leak through center hole 226 into the vacuum chamber. Actuator 228 is adapted to move elevator 232 from one to the other of three discrete positions. The first position (shown in dotted lines in FIG. 10) is its fully retracted or bottom position in which it is located in a hole 220 in bottom wall 172 below turntable 42. The third position (shown in full lines in FIG. 10) is its fully extended or top position in which it is located in hole 180 and protrudes above the carrier stop members 190 and 192 into the bottom end of sleeve 132. The second position is an intermediate or midpoint position in which it is located in a hole 110 of the turntable.

Figure 11:
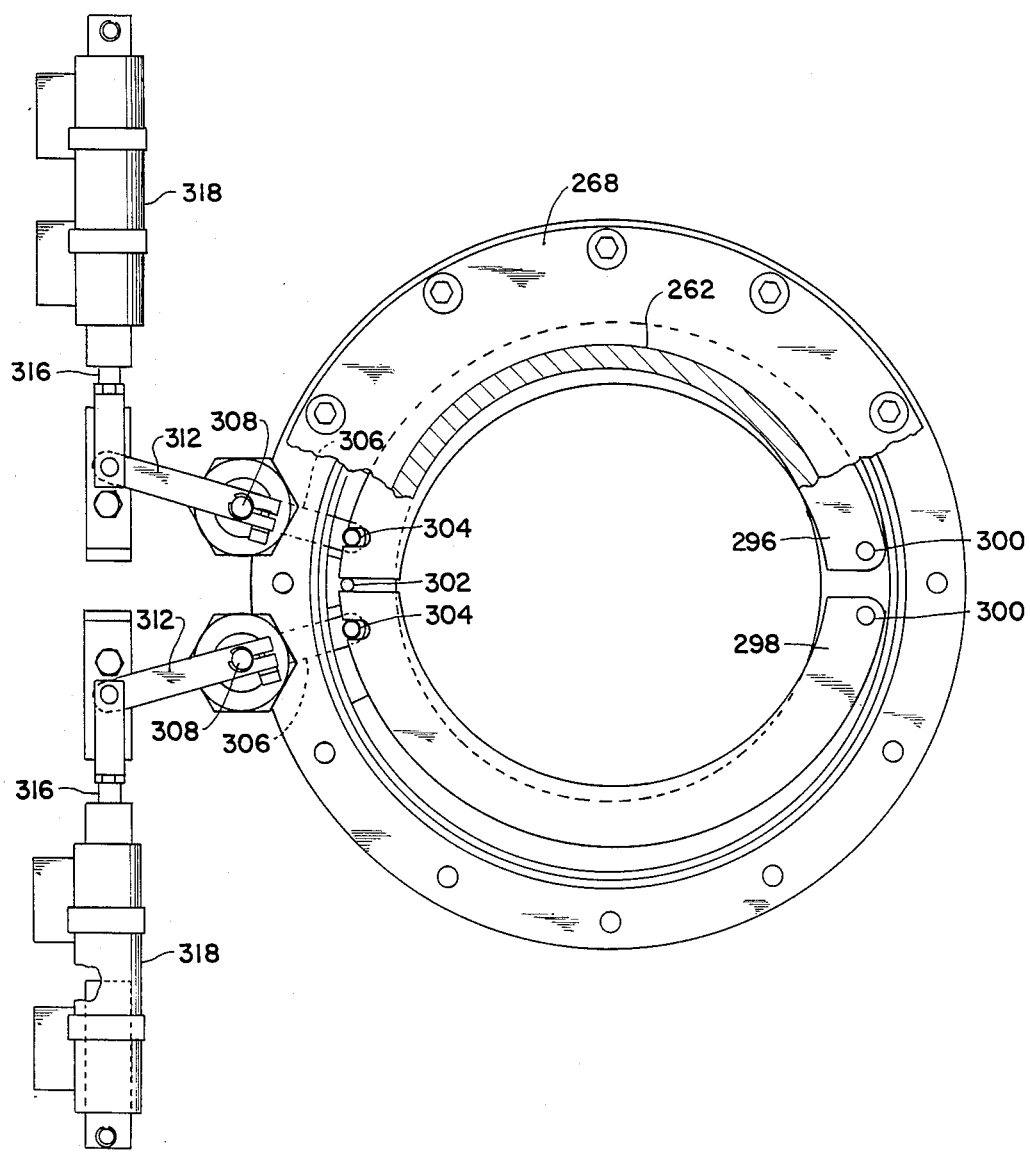
FIG. 11 is a plan view, partly in section, of the output stack assembly.

Referring now to FIGS. 11 and 12, bolted to the underside of platform 32 at aperture 126 is an output stack assembly 259 that functions as an output lock. The output stack assembly comprises a collar 260, a sleeve 262, an outer cylindrical jacket 264 forming two roughing chambers 266A and 266B, and a bottom flange 268 on sleeve 262 that is bolted to the upper wall 170 of vacuum chamber 34.

The inner diameter of sleeve 262 is slightly smaller than the outer diameter of the outer portion 24 of sealing element 20 in unflexed condition, i.e., when the portion 24 of the sealing element is not being compressed radially toward inner portion 22, whereby when a carrier is pushed into and through sleeve 262, its sealing element 20 will make a sliding hermetic seal with sleeve 262. The diameter of aperture 126 and the inner diameter of collar 260 may be larger than, but preferably are the equal to the inner diameter of sleeve 262. Referring now to FIGS. 3, 11 and 12, sleeve 262 has a plurality of small holes 269A and B that communicate with chambers 266A and 266B respectively, and jacket 264 has two ports 270A and 270B. Port 270B is connected to an exhaust valve that effectively reduces the pressure in sleeve 262 to approximately ½ atmospheric pressure while port 270A is vented directly to the atmosphere. Consequently, a carrier inside of sleeve 262 will face a pressure that is atmospheric or increasingly near-atmospheric pressure as it reaches the top of sleeve 262. The fluid pressure at the bottom of sleeve 262 is less than the fluid pressure at the top of that sleeve only when one or more carriers are disposed therein, since each carrier forms a separate seal with the sleeve.

Upper wall 170 has a hole 290 that is aligned with sleeve 262. The inner diameter of hole 290 is the same as or slightly larger than the inner diameter of sleeve 262. Upper wall 170 also has a counterbore 292 and a side recess 294 (FIG. 12) that communicates with hole 290 and counterbore 292. Mounted in counterbore 292 are two semi-circular carrier stop members 296 and 298 (FIG. 11). Those members are pivotally supported at one end on pivot pins 300 that are anchored in upper wall 170 at counterbore 292. The opposite ends of carrier stop members 296 and 298 are separated by a stop pin 302 anchored in top wall 170 and have identical semi-circular notches to accommodate pins 304 that are affixed to the ends of two identical levers 306 secured to the ends of identical shafts 308. The two shafts 308 are rotatably supported in identical hermetically sealed bearing units 310 (FIG. 12) that are mounted in suitable holes in upper wall 170. The upper ends of shafts 308 protrude outside of the vacuum chamber and are connected to the ends of identical levers 312. The opposite ends of levers 312 are pivotally connected to the operating rods 316 of two pneumatic actuators 318 that are affixed to the upper side of top wall 170 of the vacuum chamber. The inner edges of carrier stop members 296 and 298 are circular and have a radius of curvature the same as that of the inner surface of sleeve 262. However, shafts 308 are located so that (a) when the operating rods 316 are retracted (as shown in FIG. 11), the two carrier stop members are positioned so that their inner edges extend into a projection of the interior space of sleeve 262, and (b) when the operating rods are extended, carrier support stops 296 and 298 are pivoted to a new position where their inner edges are aligned with the inner surface of sleeve 262. Hence when the carrier stop members are in the position of FIG. 11, they can interrupt and support a disk carrier, but when they are moved away from one another so that their inner edges are aligned with the inner surface of sleeve 262, they permit a disk carrier to be passed between them.

Referring now to FIG. 12, the bottom wall 172 of the vacuum chamber has a hole 320 that is aligned with holes 126 and 290 and sleeve 262. Affixed to the underside of wall 172 is a mounting plate 328 having a center hole 330. Bolted to mounting plate 328 is a pneumatic actuator 332. The operating or piston rod 334 of actuator 332 extends slidably through center hole 330, and attached to its upper end is a carrier elevator or platform 340. The latter has a flat top surface, plus a peripheral groove at its top end to accommodate the legs 6 of a disk carrier 2. A bellows 346 surrounds piston rod 334, with its upper end attached to elevator 340 and its lower end attached to mounting plate 328 by a collar assembly 348. Bellows 346 provides an hermetic seal around piston rod 334 so that air cannot leak through center hole 330 into the vacuum chamber. Actuator 332 is adapted to move platform 340 from one to the other of three discrete positions. The first position (shown in dotted lines in FIG. 12) is its fully retracted or bottom position in which it is located in hole 340 below turntable 42. The third position (shown in full lines in FIG. 12) is its fully extended or top position in which it is located in hole 290 and projects above the carrier stop members 296 and, 298 into the bottom end of sleeve 262. The third position is an intermediate or midpoint position in which it is located in the hole 110 of the turntable that is aligned with sleeve 262.

Figure 4:
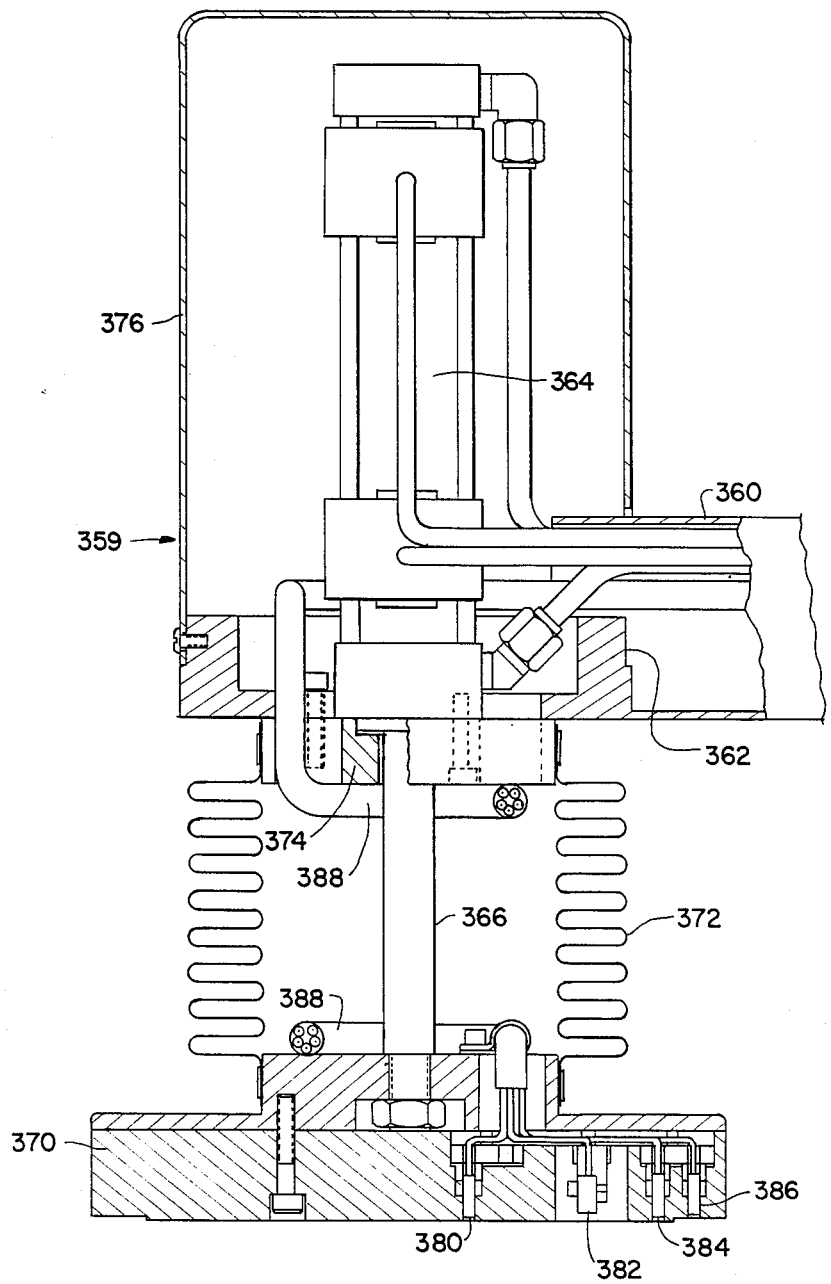
FIG. 4 is a side elevation, partly in section, of the carrier plunger assembly.

Referring now to FIGS. 2-4, carrier plunger assembly 359 is provided to force carriers down into sleeve 132 of the input stack assembly. The carrier plunger assembly comprises a hollow support arm 360 that is attached at its lower end to platform 32. The upper end of arm 360 includes an actuator support 362 to which is affixed a pneumatic actuator 364. As shown only in FIG. 4, a housing 376 may be attached to support arm 360 and support 362 in surrounding and protecting relation to actuator 364. The piston or operating rod 366 of actuator 364 is connected to a circular plunger plate 370 with an outer diameter that is slightly smaller than the diameters of the four holes 50A-D and the inner diameter of sleeve 132. A bellows 372 surrounds piston rod 366 and is connected at one end to a member 374 attached to actuator support 362 and its support end to plunger plate 370. Bellows 372 acts as a dust and oil barrier. The plunger assembly is positioned so that plate 370 is aligned with the hole 50 of turntable 40 that occupies hole position 50B (FIG. 3). The stroke of piston rod 366 is such that when it is retracted, plunger plate 370 is raised above turntable 40 (as seen in FIG. 2), and when it is extended, plunger plate 370 will penetrate hole 50B of turntable 40 to a depth about equal to or slightly below the slidable carrier holding ring 60 (FIG. 5) associated with hole 50B. Plunger plate 370 carries one or more sensors as shown at 380, 382, 384 and 386 for measuring or determining different things, e.g., proximity sensors for detecting the presence or absence of a carrier, a compact disk blank, and the inner and outer masks respectively. The electrical connections to the sensors are made via a multi-wire cable 388 that extends through actuator support 362 and inside support arm 360 to an appropriate terminal block (not shown) that connects to the controller represented in FIG. 16.

Figure 13:
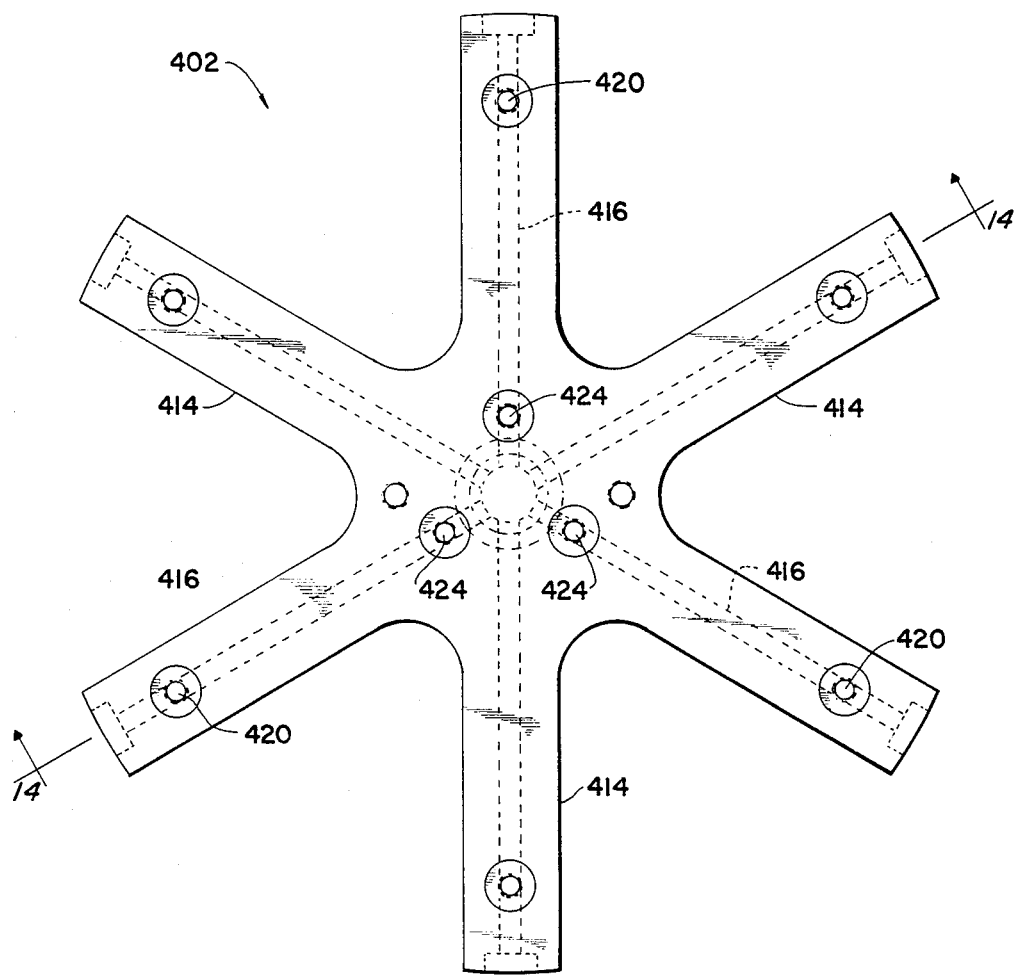
FIG. 13 is a bottom view of the mask transporting head.
Figure 14:
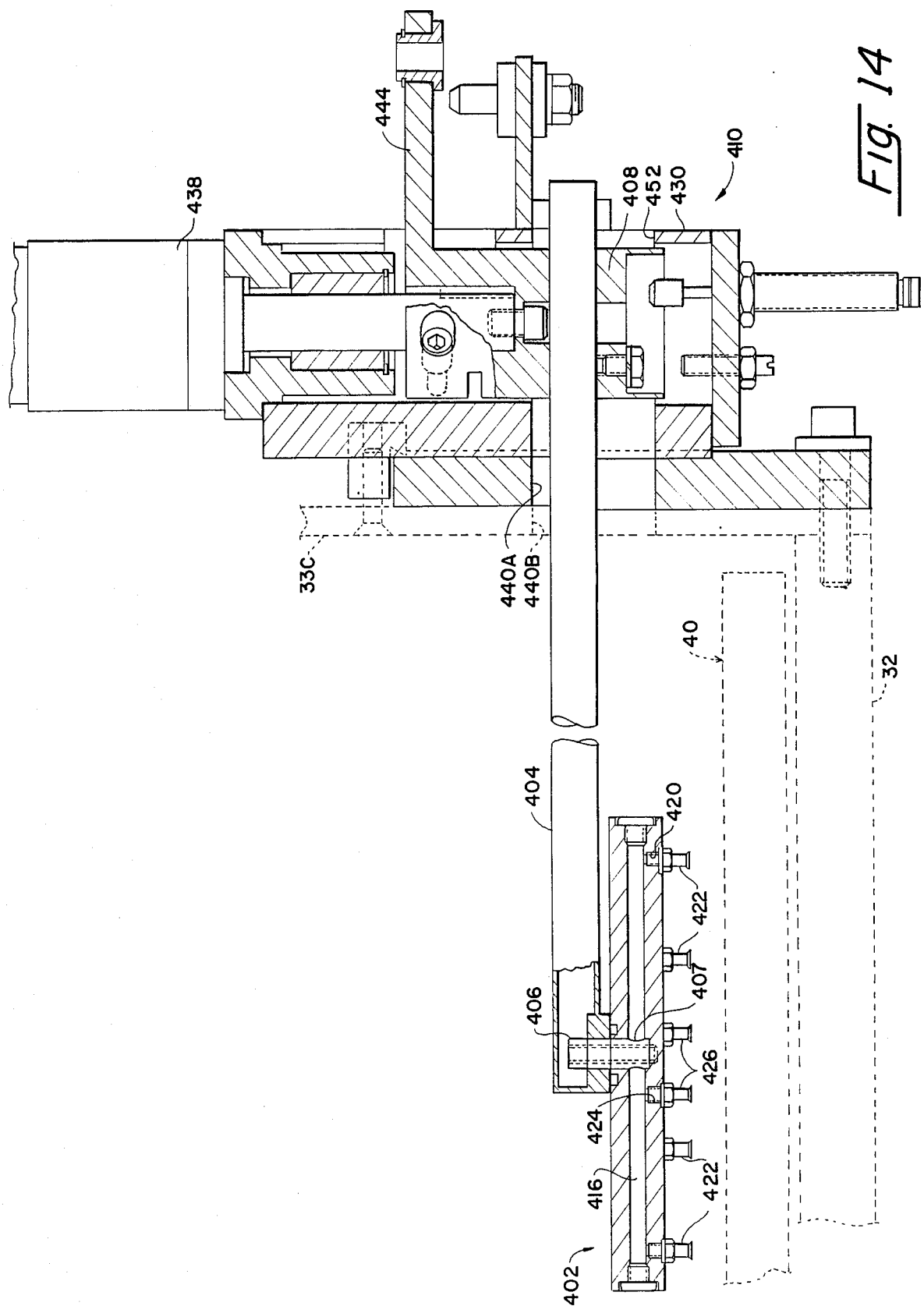
FIG. 14 is a sectional view taken along line 14—14 of FIG. 13 showing details of the mask transporting head.

Also associated with turntable 40 is a mask retrieval assembly identified generally at 400 in FIG. 3. As seen in FIGS. 2, 13 and 14, the mask retrieval assembly comprises a pickup suction head 402 attached to one end of an arm 404 by means of a hollow shaft 406. The other end of arm 404 extends through and is attached to the bottom end of a shaft 408 that forms part of a drive mechanism 410 attached to platform 32 and vertical partition 33C.

Suction head 402 is in the form of a spider having six radially extending arms 44, with each arm having a radially extending bore 416. The outer ends of bores 416 are closed off. Each arm 414 has a hole 420 on its bottom side that intersects its bore 416 and is fitted with a rubber suction cup 422. Holes 420 are located close to the ends of arms 414. Additionally, three of the arms have holes 424 on their bottom side located close to the center of the suction head. Each hole 424 is fitted with a rubber suction cup 426. Suction cups 422 and 426 are located so that when the suction head is located above hole 50C of turntable 40, and a stack of carriers with processed compact disks are located in sleeve 262 of the output stack assembly, suction cups 422 and 426 will be aligned with the outer and inner masks 18 and 14 respectively, on the topmost carrier in that stack, so that those masks may be retrieved by the suction head. Shaft 406 has an axial bore provided with six equally spaced side ports 407 that intersect bores 416. Arm 404 is hollow and serves as a passageway leading from shaft 406 to shaft 408 of drive mechanism 410. The end of arm 404 is provided with a hose fitting (not shown) for connections via a hose line (not shown) and a solenoid valve (not shown) to a source of vacuum, e.g., one of the rotary vane vacuum pumps used for the rough evacuation of sleeve 132.

Shaft 408 is mounted for reciprocal axial and rotational movement in a housing 430. Shaft 408 is attached by a rotary connection 432 to the piston rod 434 of a pneumatic actuator 438 whose cylinder is affixed to housing 430. The latter and partition 33C have aligned elongated openings 440A and 440B to permit vertical and rotational movement of arm 404. Shaft 408 also has an arm 444 that is pivotally connected to the piston rod 446 of a pneumatic actuator 448 (FIG. 3) that is pivotally mounted to a support member 450 affixed to housing 430. Housing 430 has a second elongated opening 452 to permit axial and swinging movement of arm 444. Actuator 438 raises and lowers arm 404, while actuator 448 swings it to move head 402 into and out of alignment with holes 50B and 50C.

Drive mechanism 410 is adapted to cause shaft 408 and arm 404 to undergo a six step cycle of movement involving both vertical and horizontal displacement of the suction head. Assuming that suction head 402 is aligned with but spaced above hole 50C of turntable 40 and no vacuum connection is made to that head, the first step is to lower shaft 408 and arm 404 so as to place suction cup 422 and 426 against the inner and outer masks 14 and 18 on the disk carried by the uppermost carrier in the stack of carriers in output lock 259 (FIG. 12). A fluid connection is then made between the suction head 402 and its vacuum source so that suction cups 322 and 326 will provide a suction force to grip the inner and outer masks respectively. Next, shaft 408 and arm 404 are lifted so that the suction head will move up away form the topmost carrier in the output stack, with the two masks gripped by its suction cups. Then shaft 408 and arm 404 are rotated clockwise (as seen in FIG. 3) so as to locate the suction head above hole 50B. Next, shaft 408 and arm 404 are lowered so as to bring the suction head adjacent to the carrier held in hole 50B of turntable 40. Thereafter, suction to head 402 is terminated, releasing the two masks onto the disk carried by the uppermost carrier in the input stack assembly. The suction head is then raised again and swung counterclockwise 90 degrees to again place it in alignment with hole 50C.

Referring now to FIGS. 2 and 3, associated the vacuum chamber 34 are two disk-processing units 36 and 38 that are attached to and supported by the upper wall, 170 of vacuum chamber 34. The two processing units are attached to upper wall 170 in alignment and communication with openings (not shown) in upper wall 170 that communicate with the interior volume of chamber 34. Those openings are spaced from one another, and also from openings 124 and 126, by angular increments of 90 degrees.

In the preferred embodiment of the invention, processing unit 36 is a glow discharge (plasma) disk-cleansing means that comprises a housing 504 that is secured to and hermetically sealed with respect to upper wall 170. The construction of the glow discharge cleansing unit 36 is not shown since such cleansing units are well known in the art and any one of several different kinds of glow discharge cleansing units may be used satisfactorily with the present invention. By way of example, the glow discharge means may comprise a device of the kind made and sold by Balzers USA of Hudson, N.H.

Still referring to FIGS. 2 and 3, processing unit 38 is a vacuum-type metal coating device. It comprises a housing 508 that is secured to and hermetically sealed with respect to upper wall 170, and other components 510 and 512 that are required to provide controlled metal deposition. Details of construction of the vacuum coating device are not shown since such devices are well known in the art and any one of several different kinds of vacuum coating devices may be used with the invention. By way of example, but not limitation, the coating device may be a sputtering type metal-coating device. Preferably processing unit 38 comprises a planar magnetron-type sputtering source, e.g. a planar magnetron-type sputtering source of the sort used in the Balzers LLS 801 sputtering system sold by Balzers USA of Hudson, N.H.

FIG. 15 schematically illustrates the vacuum system of the machine. The glow discharge processing unit 36 and the sputtering source processing unit 38 are connected to separate turbo-molecular pumps 540 and 542 which are in turn connected to a rotary vane vacuum pump 546.

It is to be understood that the vacuum chamber comprises a loading station located in line with the input stack, a glow discharge station located in line with the glow discharge unit 36, a plating station located in line with the magnetron unit 38, and an output station located in line with the output stack. Advancement of a carrier supported disk from one station to the other is accomplished by operation of turntable 42. The vacuum chamber comprises three different pressure zones. One pressure zone is beneath the input and output stacks, i.e., essentially the same pressure exists at the bottom ends of both stacks. The second pressure zone is in the cleaning station which is located below and communicates with the glow discharge cleaning unit 36. The third pressure zone is in the plating station which is located directly beneath and communicates with the plating unit 38.

The turbo-molecular pumps 540 and 542 are operated so as to maintain the vacuum in the processing units 36 and 38 at selected values so as to maintain the pressure in the cleaning station of the vacuum chamber and the pressure in the plating station of the vacuum chamber at the levels required for proper disk cleansing and disk plating. In this connection it must be noted that a dynamic pressure differential may exist between the two process stations.

Additionally, as seen in FIG. 15, each of the processing units 36 and 38 is provided with its own supply of process gases. Therefore not only can the pressure differ in the cleansing and plating stations, but also the gaseous environment in the two stations will usually differ due to the particular requirements of the cleansing and plating operations.

FIG. 16 is a schematic diagram of the control system of a disk-coating machine constituting a preferred embodiment of the invention.

FIG. 16 comprises a programmable controller 600 which includes a microprocessor 602 and associated logic and memory circuits 604. The controller is adapted to receive input signals and generate output signals in response to (1) the input signals and/or (2) the computer program. The latter may be stored in a peripheral device, but preferably it is stored in logic and memory circuits 604. The input signals comprise those from sensors 380, 382, 384 and 386 and may include feedback signals from motors 44 and 112 and/or clutch-brake units 46 and 114. Still other sensors may provide signals, e.g., one or more sensors may provide signals showing that the disk-feeding mechanism (not shown) or the disk-removing mechanism (not shown) is not operating whereby the controller will respond by shutting down the disk processing machine. The output signals are used to control various devices, e.g., to operate the various vacuum pumps, to operate the valves used to control the flow of process gases, to test the sensors, to turn motors 44 and 112 "on" and "off" and-/or to operate clutch/brake units 46 and 114, to control vacuum pumps 163 and 188, to operate solenoid valves 610 that control application of pressurized air from a compressor 612 to actuators 102, 214, 228, 318, 332, 364, 438 and 448, to operate a solenoid valve 614 that controls application of suction to pickup head 402 by a vacuum source 616 (that may be the vacuum pump 163), and to control operation of other components of the machine. The controller also provides signals for interfacing the machine with disk-feeding and disk-removing devices represented schematically at 700 and 702, so that the latter will operate in synchronism with the machine The computer program for controlling operation of controller 600 is not disclosed for several reasons: (1) the exact program will vary with the specific microprocessor 602 that is used in the machine, (2) the program may be varied according to principles well known in the art to achieve the same result, (3) providing a suitable computer program based on known machine capabilities and desired performance is well within the skill of experienced computer programmers.

MODE OF OPERATION OF PREFERRED EMBODIMENT OF INVENTION

Following is a description of the method of the present invention as exemplified by the mode of operation of the preferred embodiment of apparatus made in accordance with the invention.

The following description relates to the above-described preferred form of apparatus made in accordance with the invention and assumes that all of the carriers 2 are of identical construction, size and configuration. Although not shown, it is to be understood that a disk feeding mechanism is provided to place an annular plastic video recording disk blank (not shown) on an empty carrier 2 carried by turntable 40 when that empty carrier is located in the position illustrated by hole 50A, and a disk discharge mechanism (also not shown) is used to remove a metal coated optical recording disk (not shown) from turntable 40 when the disk is at the position illustrated by hole 50D.

In the following description, the four positions occupied by each hole 110 of turntable 42 as the latter is rotated in a stepwise motion are designated as follows:
110A—the hole is aligned with input lock 119, and hole 50B, 110B—the hole is aligned with cleaning station 36, 110C—the hole is aligned with plating station 38, and 110D—the hole is aligned with output lock 259 and hole 50C.

To facilitate description and understanding of the machine and method of the present invention, assure that the following conditions exist:

(1) the input and output locks 129 and 259 are full of carriers 2, with the carriers in the input lock carrying a compact disk blank 10 and inner and outer masks 14 and 18, and the carriers in the output lock carrying the masks and compact disk blanks that have been metallized;

(2) the turntables 40 and 42 are stationary in the positions shown in FIG. 3;

(3) the turbomolecular pump 168 has pumped the bottom end of the input lock and the interior of the vacuum chamber 34 down to a pressure of between $10^{-3}$ to $10^{-6}$ mm. mercury, while the two rotary vane pumps maintain the pressure at the top end of the input lock at a pressure of about 100 to about $10^{-1}$ mm. mercury, and the turbo-molecular pumps 540 and 542 have pumped the glow discharge unit 36 and the magnetron sputtering source 38 down to the levels desired for the disk cleaning and disk plating operations, typically in a range of $10^{-3}$ to $10^{-6}$ mm. Hg.;

(4) all four of the latch type carrier holding means (50,60) are in their carrier-holding position;

(5) input carrier stop members 190 and 192 are in their closed stack-supporting position;

(6) output carrier stop members 296 and 298 are in their closed stack-supporting position;

(7) input lock platform 232 is in its bottommost position as shown in dotted lines in FIG. 10;

(8) output lock platform 340 is in its bottommost position as shown in dotted lines in FIG. 12;

(9) the disk cleaning and plating stations 36 and 38 are at the same pressure as the vacuum chamber and are not operating;

(10) carrier plunger assembly 359 is in raised position;

(11) mask retrieval assembly 400 is aligned with but elevated above hole 50C;

(12) turntable 40 supports an empty carrier in aperture 50A, a carrier with a compact disk blank but no plating masks in aperture 50B, and a carrier with a metallized disk but no masks 14 and 18 in aperture 50D, while aperture 50C is empty;

(13) turntable 42 supports no carrier in its hole 110A, a carrier with an uncleaned compact disk blank and masks in its hole 110B, a carrier with a cleaned but unplated compact disk blank and masks in its hole 110C, and a carrier with a freshly plated disk and masks in its hole 110D.

With the foregoing conditions in existence, the mode of operation of the illustrated machine and the method of the invention involves the following combinations of steps:

(1) The metallized disk is removed from the carrier that is supported in aperture 50D and a new disk blank is placed on the carrier supported in aperture 50A.

(2) Substantially simultaneously, stop members 190,192 and 296,298 are moved to open position, and arm 90B is operated to move the latch-type carrier holding means for hole 50C to open position.

(3) Then input lock platform 232 is raised to its intermediate position inside the hole 110A, and output platform 340 is raised to its topmost position. The raising of platform 340 forces the carrier in hole 110D up into the output lock, thereby engaging the stack of carriers in that lock and forcing the stack to move upward far enough to place the topmost carrier in the output stack assembly in hole 50D of turntable 40.

(4) Next arm 90B is operated to move the carrier holding means associated with hole 50C to closed position, so as to support the carrier that has been received from the output lock 259.

(5) Platform 340 is lowered to its intermediate position, then stop members 296,298 are moved to closed position to support the stack of carriers in the output lock, and thereafter platform 340 is lowered to its bottommost position so as not to interfere with subsequent movement of turntable 42.

(6) Simultaneously with or shortly after (2) above, cleaning station 36 and plating station 38 are turned on to effect cleaning and plating of the disks that are disposed in holes 110B and 110C. Preferably these operations may be initiated at the same time as or shortly after platform 340 is raised to its topmost position.

(7) The mask retrieval mechanism is operated to cause pickup head 402 to (a) drop down and engage the masks 14 and 18 on the carrier supported in turntable hole 50C, (b) grasp the masks by suction, (c) move up away from the carrier in hole 50C, (d) swing 90 degrees to place the pickup head over hole 50B, (e) drop down so as to place the masks in contact with the disk blank on the carrier supported in hole 50B, (f) momentarily terminate the suction to pickup head 402 so as to release the masks held by the pickup head and allow them to rest freely on the blank disk in hole 50B, (g) move up away from turntable 40, and (h) swing back into alignment with hole 50C.

(8) Platform 232 is raised to its intermediate position, arm 90A is moved to shift the latch type carrier holding means associated with hole 50B to open position so as to release the carrier with the newly masked disk blank, and then next stop members 190,192 are moved to open position.

(9) Then plunger assembly 400 is operated to push down on the carrier disposed in hole 50B, forcing the entire stack of carriers in input lock 129 down onto platform 232.

(10) Next, stop members 190,192 are moved to closed position to engage the next to bottommost carrier in the input stack and thereby support that carrier and all those above it, while the bottommost carrier rests on platform 232.

(11) Thereafter, platform 232 is lowered back to its bottommost position, causing the bottommost carrier to be supported in the aperture 110A of turntable 42.

(12) The latch-type carrier holding means associated with hole 50B is moved back to closed or carrier supporting position, and turntable 40 is rotated 90 degrees so as to advance the disk-carrying carrier received from output lock 259 to hole position 50D.

(13) The cleaning and plating stations are turned off at selected times.

(14) Turntable 42 is rotated 90 degrees so as to advance the disk-supporting carrier received from input stack assembly 129 to cleaning station 36, and also advance the newly cleaned disk to the plating station and a newly plated disk to the hole 110D position in line with output lock 259.

(15) Steps (1) through (9) are repeated.

From the standpoint of individual disks, the method of the present invention may be described as follows:

(1) a disk is loaded onto an empty carrier (hereinafter the "disk/carrier unit") at hole position 50A;

(2) the disk/carrier unit is moved to hole position 50B;

(3) inner and outer masks 14 and 18 are applied to the disk/carrier unit at hole 50B;

(4) the disk/carrier unit is pushed down into the top end of the input stack assembly (input lock) 129;

(5) the disk/carrier unit is pushed down along the input stack assembly a distance equal to one disk/carrier unit thickness each time a new disk/carrier unit is pushed down into the input stack assembly;

(6) the disk/carrier unit is pushed out of the bottom end of the input stack assembly;

(7) the disk/carrier unit is transported into the cleaning station and subjected to cleaning for a predetermined period of time;

(8) the disk/carrier unit is moved from the cleaning station into the plating station and subjected to plating for a predetermined period of time;

(9) the disk/carrier unit is moved from the plating station to the output stack assembly 259;

(10) the disk/carrier unit is pushed up into the bottom end of the output stack assembly;

(11) the disk/carrier unit is pushed up along the output stack assembly a distance equal to one disk/carrier unit thickness each time a new disk/carrier unit is pushed up into the input stack assembly;

(12) the disk/carrier unit reaches the top end of the output stack assembly and is forced into a hole in turntable 40 at hole position 50C;

(13) the masks are removed from the disk/carrier unit at hole 50C;

(14) the mask-free disk/carrier unit is moved to hole position 50D where the disk is removed from the disk/carrier unit, leaving only the disk-free carrier;

(15) the disk-free carrier is moved to hole position 50A; and

(16) steps (1) through (15) are repeated.

It is to be understood that the apparatus and method of the present invention may be practiced in a manner, or with a means, not identical to what is presented in the foregoing description, since alternative but obvious ways and means to achieve the same results in substantially the same way may be readily determined by persons skilled in the art from the foregoing description. Thus, for example, hydraulic or electrical actuators may be used in place of the pneumatic actuators hereinabove described. Alternatively the relative positions of turntable 40 and vacuum chamber 34 may be changed so that carriers enter the bottom end and exit the top end of the input lock, and enter the top end and exit the bottom end of the output lock. Similarly, the exact order of the steps described hereinabove may be changed. Still other changes in the apparatus and procedural steps outlined above may be made without departing from the essential features and requirements of the present invention.

What is claimed is:

1. An apparatus for processing blank compact disks, wherein the blank disks are supported individually on identical disk carriers, with each disk carrier having on determined peripheral configuration, said apparatus comprising the following components:

means defining a vacuum chamber;

means defining an elongate input chamber for receiving said disk carriers one by one and holding them in a first input stack, said input chamber having a first end adapted to receive a disk carrier and a second opposite end that communicates with said vacuum chamber, said input chamber having an internal cross-sectional configuration that is identical in shape to said predetermined peripheral configuration and is sized so as to make a sliding hermetic seal fit with each sealing element;

means defining an elongate output chamber for receiving said disk carriers one by one and holding them in a second output stack, said output chamber having a first end that communicates with said vacuum chamber and a second opposite end for discharging carriers, said output chamber having an internal cross-sectional configuration that is identical in shape to said predetermined peripheral configuration and is sized so as to make a sliding hermetic seal fit with each of said sealing elements;

a first disk carrier transporting means comprising a first turntable mounted for rotational movement on a first axis, said first turntable having a plurality of first apertures each slightly oversized with respect to the largest diameter of said carriers, and a plurality of first disk carrier holding means each associated with one of said first apertures, each of said first disk carrier holding means being arranged to move from a first closed state in which said each first carrier holding means is positioned to support a carrier in alignment with one of said first apertures to a second open state in which said first carrier holding means is positioned to release a carrier so as to render it free to be moved vertically away from said first turntable;

a second disk carrier transporting means comprising a second turntable mounted for rotational movement on a second axis that is parallel to said first axis, said second turntable being located within said vacuum chamber and having a plurality of second apertures each sized to receive and support one of said carriers;

said first and second turntables being disposed in parallel planes and said first and second axes being spaced from one another so that a circle drawn through the center of said first apertures will be tangent to a circle drawn through the centers of said second apertures;

first and second drive means for rotating said first turntable intermittently through an angle equal to the angle between successive first and second apertures respectively, so that each time either of said turntables is stopped, two of said second apertures will be in axial alignment with two of said first apertures;

a plurality of said disk carriers;

a plurality of masks adapted to cover selected portions of blank disks that are adapted to be carried by said carriers;

means for selectively removing at least one mask from a disk carrier positioned at said second end of said output chamber and transferring said at least one mask onto a carrier positioned at said first end of said input chamber;

first carrier moving means associated with said one end of said input chamber for engaging the carrier in said first input stack that is nearest said one end and forcing said input stack of carriers axially toward the other end of said input chamber so as to cause a carrier at said other end of said first stack to drop onto said second turntable;

second carrier moving means associated with said one end of said output chamber for engaging the carrier in said second output stack that is nearest said one end and forcing said output stack axially toward the other end of said output chamber, so as to cause a carrier at said other end of said second stack to move into an aperture of said first turntable;

at least first and second processing stations communicating with said vacuum chamber, said processing stations being located so that rotation of said second turntable will cause said second apertures to move into and out of alignment with said processing stations;

means for operating the foregoing means so as to sequentially cause a carrier to be moved (a) from said input stack to said second turntable, (b) on said second turntable through said at least first and second processing stations, and (c) from said second turntable to said output stack;

said carriers making a sliding hermetic seal with said input and output chambers as they move through said chambers.

2. Apparatus according to claim 1 wherein said first processing station comprises a disk cleansing station.

3. Apparatus according to claim 2 wherein said first processing station comprises a glow discharge cleansing station.

4. Apparatus according to claim 1 wherein said second processing station comprises a metal coating station.

5. Apparatus according to claim 1 wherein said second processing station comprises a metal coating sputter device.

6. Apparatus according to claim 1 wherein said first turntable is located at a level higher than said second turntable.

7. Apparatus according to claim 1 wherein said first turntable has at least four apertures.

8. Apparatus according to claim 1 wherein said second turntable has at least four apertures.

9. Apparatus according to claim 1 wherein said sealing elements have a circular outer configuration, and further wherein said input and output chambers are characterized by inner surfaces having circular configurations.

10. Apparatus according to claim 1 wherein said first and second carrier moving means comprise powered actuators having reciprocally movable carrier-engaging means for engaging a carrier and forcing it and adjacent carriers axially along said input and output chambers respectively.

11. Apparatus according to claim 1 further including electrically controlled carrier-supporting means for supporting and releasing carriers disposed in said first apertures.

12. Apparatus according to claim 1 further including electrically-controlled stop means for controlling feeding of carriers into said second output chamber from said vacuum chamber.

13. Apparatus according to claim 1 further including a disk-receiving station where blank disks are placed on said carriers.

14. Apparatus according to claim 13 further including a disk-removing station wherein coated disks are removed from said carrier.

15. Apparatus according to claim 14 wherein said first turntable conveys blank disks from said disk-receiving station to said input chamber and said second turntable conveys coated disks from said output chamber to said disk-removing station.

16. Method of processing compact disks comprising the following steps:
   (a) delivering a disk to a disk carrier disposed in a disk loading station, said disk carrier having a larger diameter than said disk and having a sealing element at its periphery;
   (b) transferring said disk carrier and disk to a mask-receiving station;
   (c) covering said disk with at least one mask component at said mask-receiving station;
   (d) transferring said disk carrier with the mask-covered disk to a first carrier-transfer station that comprises an elongated input chamber at a controlled reduced pressure;
   (e) shifting said disk carrier with the mask-covered disk along said input chamber to a second carrier-transfer station;
   (f) transferring said disk carrier with the mask-covered disk from said second carrier-transfer station to at least one disk-processing station;
   (g) treating said disk in at least one disk-processing station;
   (h) transferring said disk carrier with the treated mask-covered disk from said at least one disk-processing station to a third carrier-transfer station that comprises an elongated output chamber;
   (i) shifting said disk carrier with the treated mask-covered disk along said output chamber to a mask-removal station;
   (j) removing said at least one mask component from the treated mask-covered disk at said mask-removal station and transferring said at least one mask component to another disk supported by another disk carrier located at said mask-receiving station;
   (k) transferring said disk carrier with the treated mask-free disk from said mask-removal-station to a disk-unloading station;
   (l) removing said treated mask-free disk from said disk carrier at said disk-unloading station;
   (m) transferring the disk-free disk carrier from said disk-unloading station to said disk-loading station; and
   (n) repeating the foregoing steps commencing with delivery of a disk to the disk-free disk carrier at said disk-loading station.

17. Method according to claim 16 wherein said disk is moved through and treated in at least two disk-processing stations.

18. Method according to claim 17 wherein said first disk-processing station comprises a plasma cleaning station.

19. Method according to claim 17 wherein said second disk-processing station comprises a metal coating station.

20. Method according to claim 19 wherein said second disk-processing station comprises a sputtering device.

21. Method according to claim 17 wherein said disk carrier and said disk are transferred from said second carrier transfer station through said at least first and second disk-processing station to said third carrier-transfer station by means of a turntable.

22. Method according to claim 16 wherein said disk carrier and said disk are transferred from said disk loading station to said mask-receiving station by means of a turntable.

23. Method according to claim 16 wherein said disk carrier and said disk are transferred from said mask-removal station to said disk-unloading station by means of a turntable.

24. Method according to claim 16 wherein the means used to transfer said carrier and disk from said mask-removal station to said disk-unloading station is the means used to transfer said carrier and disk from said disk-loading station to said mask receiving station.

25. Method according to claim 16 wherein said disk carrier and said disk are shifted along said input chamber to said second carrier-transfer station by means of an electrically controlled actuator.

26. Method according to claim 16 wherein said disk carrier and said disk are shifted along said output chamber to said mask-removal station by means of an electrically controlled actuator.

27. Method according to claim 16 wherein said disk carrier and disk are transferred from said disk-loading station to said mask-receiving station and from said mask-removal station to said disk-unloading station by a first turntable, and said disk carrier and said disk are transferred from said second carrier-transfer station through said first and second disk-processing station to said third disk carrier-transfer station by means of a second turntable, and further wherein said turntables are operated stepwise and in synchronism with each other.

28. An apparatus for processing articles at very low atmospheric pressures wherein the articles are positioned individually on identical carriers as they are being processed, with each carrier having on its periphery a resilient sealing element having a predetermined peripheral configuration, said apparatus comprising the following components:
   a vacuum chamber;
   means for maintaining the pressure in said vacuum chamber at a pressure at least as low as $10^{-4}$ mm. mercury;
   means defining an elongate input chamber for receiving said carriers one by one and holding them in a first input stack, said input chamber communicating with said vacuum chamber and having first and second opposite ends and an internal cross-sectional configuration that is identical in shape to said predetermined peripheral configuration and is sized so as to make a sliding hermetic seal fit with each sealing element;
   means defining an elongate output chamber for receiving said carriers one by one and holding them in a second output stack, said output chamber communicating with said vacuum chamber and having first and second opposite ends and an internal cross-sectional configuration that is identical in shape to said predetermined peripheral configuration and is sized so as to make a sliding hermetic seal fit with each of said sealing elements;

a first carrier transporting means for transporting carriers to said input chamber and for removing carriers from said output chamber, said first carrier transporting means comprising a plurality of mutually spaced first carrier receivers each slightly oversized with respect to the largest diameter of said carriers, and a plurality of first carrier-holding means each associated with one of said first receivers, each of said first carrier-holding means being arranged to move from a first closed state in which said each first carrier-holding means is positioned to support a carrier in one of said first receivers to a second open state in which said each first carrier-holding means is positioned to release a carrier so as to render it free to be moved vertically away from said first carrier transporting means;

a second carrier transporting means for transporting carriers from said input chamber to said vacuum chamber and for removing carriers from said vacuum chamber to said output chamber, said second carrier transporting means comprising a plurality of mutually spaced second carrier receivers each sized to receive and support one of said carriers;

said first and second carrier transporting means being disposed in parallel planes;

first and second drive means for moving said first and second carrier transporting means intermittently so that each time either of said carrier transporting means is stopped, at least one of said first receivers will be aligned with said input chamber or said output chamber and at least one of said second carrier receivers will be aligned with said input chamber or said output chamber;

means for applying a plating mask to each carrier before it enters said input chamber;

means for selectively removing a plating mask from a carrier discharged from said output chamber and transferring said at least one mask onto a carrier to be received by said input chamber;

first carrier moving means associated with said input chamber for engaging said first stack of carriers at one end of said input chamber and forcing said first stack of carriers axially toward the other end of said input chamber, so as to cause a carrier at the other end of said first stack to be received by said second transporting means;

second carrier moving means associated with said output chamber for engaging said second stack of carriers at one end of said output chamber and forcing said second stack axially toward the other end of said output chamber, so as to cause a carrier at said other end of said second stac to be received by said first transporting means;

at least first and second article-processing stations each communicating with said vacuum chamber; and means for operating the foregoing means so as to sequentially cause a carrier to be moved: (a) into said input chamber for addition to said input stack, (b) from said input stack through said at least first and second processing stations, and (c) from the last-in-line of said at least first and second processing stations to said output chamber;

said carriers making a sliding hermetic seal with said input and output chambers as they move therethrough.

29. An apparatus according to claim 28 wherein said second carrier transporting means is adapted to move said carriers out of said output chamber.

30. An apparatus according to claim 28 wherein said first and second carrier transporting means are turntables.

* * * * *

UNITED STATES PATENT AND TRADEMARK OFFICE
CERTIFICATE OF CORRECTION

PATENT NO. : 4,857,160
DATED : August 15, 1989
INVENTOR(S) : Richard F. Landau et al It is certified that error appears in the above-identified patent and that said Letters Patent is hereby corrected as shown below:

Claim 1, column 17, line 7, after the word "on" insert -- its periphery a resilient sealing element having a pre- --;

Claim 16, column 19, line 20, there should be a comma after the word "disks";

Claim 16, column 19, line 22, there should be a hyphen after the word "disk" (last occurrence);

Claim 21, column 20, line 13, the word "station" should be -- stations --; and

Claim 28, column 22, line 19, the word "stac" should be -- stack --.

Signed and Sealed this

Twenty-sixth Day of June, 1990

*Attest:*

HARRY F. MANBECK, JR.

*Attesting Officer*      *Commissioner of Patents and Trademarks*